(12) United States Patent
Korenaga

(10) Patent No.: US 6,665,053 B2
(45) Date of Patent: Dec. 16, 2003

(54) SUPPORTING SYSTEM IN EXPOSURE APPARATUS

(75) Inventor: Nobushige Korenaga, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 164 days.

(21) Appl. No.: 09/784,054

(22) Filed: Feb. 16, 2001

(65) Prior Publication Data

US 2001/0031191 A1 Oct. 18, 2001

(30) Foreign Application Priority Data

Feb. 18, 2000 (JP) ........................... 2000/041571

(51) Int. Cl.[7] ............... G03B 27/58; G03B 27/62; G03B 27/42; B64C 17/06; H02K 41/00
(52) U.S. Cl. ............... 355/72; 355/75; 355/53; 318/649; 310/12
(58) Field of Search ............ 355/77, 72, 75, 355/53; 378/34; 310/12, 90.5; 248/638; 356/399; 318/118, 135

(56) References Cited

U.S. PATENT DOCUMENTS

| 5,608,773 A | 3/1997 | Korenaga et al. ......... 378/34 |
| 5,780,943 A | 7/1998 | Ono ......................... 310/12 |
| 5,841,250 A | 11/1998 | Korenage et al. .......... 318/135 |
| 6,002,465 A | 12/1999 | Korenaga .................. 355/53 |
| 6,040,675 A | 3/2000 | Ono ......................... 318/649 |
| 6,107,703 A | 8/2000 | Korenaga et al. .......... 310/12 |
| 6,114,788 A * | 9/2000 | Vuillemin (Muller) et al. .. 310/90.5 |
| 6,128,069 A | 10/2000 | Korenaga et al. .......... 355/53 |
| 6,160,338 A | 12/2000 | Ono ......................... 310/309 |
| 6,172,738 B1 | 1/2001 | Korenaga et al. .......... 355/53 |
| 6,177,978 B1 | 1/2001 | Korenaga .................. 355/53 |

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

Disclosed is a supporting system having a carrying member for carrying a workpiece thereon and a supporting mechanism for supporting the carrying member from a workpiece transfer position to a workpiece processing position, wherein, adjacent the transfer position, the weight of the carrying member and a force to be applied to the carrying member are substantially balanced, and wherein, adjacent the workpiece processing position, the weight of the carrying member and a force to be applied to the carrying member are substantially balanced.

16 Claims, 27 Drawing Sheets

SUPPORTING SYSTEM IN EXPOSURE APPARATUS

FIELD OF THE INVENTION AND RELATED ART

This invention relates to a supporting system suitably usable, for example, in a fine-motion stage of a wafer stage incorporated into a semiconductor exposure apparatus.

FIG. 28 is a perspective view of a wafer rough-motion stage of a supporting system used in a semiconductor exposure apparatus. In this wafer rough-motion stage, a Y yaw guide 202 is fixed on a base table 201, and a Y stage 203 which is guided by a side face of the Y yaw guide 202 and a top face of the base table 201 is slidably supported on the base table 201 by means of an air slide (not shown) along a Y direction. The Y stage 203 consists mainly of four components, that is, two X yaw guides 204, a Y large slider 205 and a Y small slider 206. The Y large slider 205 is opposed to the side face of the Y yaw guide 202 and the top face of the base table 201, through air pads (not shown) provided at the side and bottom faces thereof. The Y small slider 206 is opposed to the top face of the base table 201 through air pads (not shown) provided at the side face thereof. With this structure, the Y stage 203 as a whole is supported on the top face of the base table 201 and the side face of the Y yaw guide 202, slidably in the Y direction.

On the other hand, an X stage 210 is guided by the top face of the base table 201 and the side faces of the two X yaw guide 204 which are components of the Y stage 203. The X stage 210 is provided so as to surround the X yaw guide 204 of the Y stage 203, around the X axis. The X stage 210 is supported slidably, in the X direction, by means of an air slide (not shown). The X stage 210 consists mainly of for components, that is, two X stage side plates 211, an X stage top plate 212 at the top end, and an X stage bottom plate 213. The bottom plate 213 is opposed to the top face of the base table 201 through air pads (not shown) which are provided at the bottom face of the bottom plate. The two X stage side plates 211 are opposed to the side faces of the two X yaw guides 204, which are components of the Y stage 203, through air pads (not shown) provided at the side faces of the side plates The bottom face of the X stage top plate 212 and the top face of the X yaw guide 204, as well as the top face of the X stage bottom plate 213 and the bottom face of the X yaw guide 204 are kept out of contact with each other. With this structure, the X stage 210 as a whole is supported at the side faces of the two X yaw guides 204 and the top face of the base table 201, slidably in the X direction.

As regards the driving mechanism, there are multiple-phase coil switching type linear motors 214 and 215, one for X driving and two for Y driving. A stator 216 comprises a plurality of coils 217 arrayed in the stroke direction and being inserted into a frame 218. A movable element 219 comprises a magnet unit of box shape. In accordance with the position of the movable element 219, electric currents are selectively applied to coils 217 of the stator 216, whereby a thrust is produced. Mounted on the top of the X stage top plate 212 is a fine-motion stage 221 shown in FIGS. 29 and 30.

The fine-motion stage 221 serves to position a wafer W (workpiece) placed on the X stage top plate 212, with respect to Z tilt and θ direction. By means of three Z suspension driving units 222-1 to 222-3 provided at the peripheral portion, the wafer stage top plate 223 is supported and positioned with respect to Z tilt direction. A universal joint 224 provided at the central portion serves to confine the freedom to prevent shift of the wafer stage top plate 223 in X and Y directions.

The Z suspension driving units 222-1 to 222-3 each comprises an air cylinder 226 for supporting the weight of the wafer stage top plate 223, and a Z linear motor 230 for applying a force, in the Z direction, to the wafer stage top plate 223.

The Z linear motor 230 comprises a flat coil 231 having a major or lengthwise side parallel to a horizontal line, four magnets 232 opposed, through a gap, to the major side of the flat coil 231, and two yokes 233 for circulating the magnetic flux of the magnets 232. The flat coil 231 is fixed to the X stage top plate 212, and the magnets 232 and the yokes 233 are fixed as a unit to the wafer stage top plate 223. As an electric current is applied to the flat coil 231, a force in the Z direction operates between the coil 231 and the integral structure of the magnet 232 and the yoke 233.

The air cylinder 226 comprises a supporting rod 227 and a rubber film 228. The rubber film 228 is provided at the lower portion of the wafer stage top plate 223, and it serves to define an air chamber 229 between the lower portion of the top plate 223 and the supporting rod 227. Airs are supplied through a supply port, not shown. The supporting rod 227 has an end fixed to the flat coil 231, and the other end is coupled to the rubber film 228. As a result, the weight of the wafer stage top plate 223 is supported from the X stage 210 and through the flat coil 231, the supporting rod 227 and the air chamber 229. The air chamber 229 provides a soft spring in the Z direction, so that vibration in the Z direction can be substantially blocked.

The Z linear motor 230 does not bear the function of weight support but it operates solely for the position control. With this structure, an electric current which nay otherwise cause a problem of heat generation is not flown thereto.

The universal joint 224 comprises an outer ring 236 fixed to the X stage top plate 212, an inner ring 237 fixed to the wafer stage top plate 223, and a guide 238 for slidably guiding the outer and inner rings 236 and 237. The guide 238 may comprise an air guide, for example, having an air gap of a few microns. This air gap has a ring-like shape, and the inner ring 237 and the outer ring 236 as well as the X stage top plate 212 and the wafer stage top plate 223 are guided for slidable motion along the Z and θ directions. The height of the guide 238 in the Z direction is set lower, such that motion of the inner and outer rings 234 and 236 as well as the top plates 212 and 223 in the the direction is allowed.

Although not shown in the drawings, a mechanism similar to the Z linear motor 230, including a flat coil 231 having a major or lengthwise side parallel to the vertical line, is provided, so that the wafer stage top plate 223 can be moved in the θ direction.

Mounted on the side face of the wafer stage top plate 223 is a square mirror (not shown) which enables precision measurement of the position, in six-axis direction, of the wafer stage top plate 223 by use of a laser interferometer.

In the structure described above, in conventional exposure apparatuses, a wafer W is precisely positioned with respect to the X, Y, Z, θ and tilt directions, by means of a control system (not shown) and by applying appropriate electric control to coils of rough-motion x, rough-motion Y, fine-motion Z1, fine-motion Z2, fine-motion Z3 and fine-motion θ. Then, an exposure process is performed by using exposure means (not shown), whereby a pattern of an original (not shown) is sequentially printed on a wafer W.

SUMMARY OF THE INVENTION

In accordance with an aspect of the present invention, there is provided a supporting system, comprising: a carrying nicer for carrying thereon a workpiece; and a supporting mechanism having a magnet, for supporting a weight of said carrying member; wherein a supporting force to be provided by said magnet does not change with a shift of said carrying member along a plane perpendicular to a direction in which the weight is supported.

The supporting mechanism may have a magnet and a magnetic member, wherein said magnet and said magnetic member may differ from each other in respect to a size in a direction perpendicular to a direction in which a force operates between said magnet and said magnetic member.

The supporting mechanism may include plural magnets for mutually operating a force, wherein one magnet differs from another magnet in respect to a size in a direction perpendicular to a direction in which a force operates between the magnets.

The supporting mechanism may include a magnetic member and an electromagnet, wherein said magnetic meter and said electromagnet may differ from each other in respect to a size in a direction perpendicular to a direction in which a force operates between said magnetic member and said electromagnet.

Each of said magnetic member and said electromagnet may comprise a layered structure of thin magnetic material plates.

There may be a controller for controlling an electric current to said electromagnet.

There may be a detector for detecting a clearance between said electromagnet and said magnetic member, and a circuit for feedback of a signal related to the detected clearance to an electric current to be applied to said electromagnet.

There may be a position controller for positioning said carrying member, wherein plural supporting mechanism are disposed so as not to produce a moment to said position controller.

In accordance with another aspect of the present invention, there is provided a supporting system, comprising: a carrying meter for carrying thereon a workpiece; and a supporting mechanism for supporting said carrying member, said supporting mechanism having a first element for producing a resisting force to a shift in a supporting direction, and a second element for producing a force for increasing the shift in the supporting direction; wherein said second element can produce a force for moving said carrying member downwardly.

The supporting mechanism may include a spring element and a magnet element.

Adjacent a workpiece processing position for the workpiece, a weight of said carrying masher and a combined force of said first and second elements may be substantially equal to each other.

In accordance with a further aspect of the present invention, there is provided a supporting system, comprising; a carrying maker for carrying a workpiece thereon; and a supporting mechanism for supporting said carrying member from a workpiece transfer position to a workpiece processing position, said supporting mechanism having a first element for producing a resisting force to a shift in a supporting direction, and a second element for producing a force to increase a shift in the supporting direction.

The second element for producing a force to increase the shift may produce a force to move said carrying member downwardly.

Adjacent to the workpiece processing position, the weight of said carrying member and a combined force of said first and second elements may be approximately equal to each other.

The force to be produced by said second element may be larger at the transfer position than at the workpiece processing position.

The first and second elements may include a spring element and a magnet element.

In accordance with a yet further aspect of the present invention, there is provided a supporting system, comprising: a carrying member for carrying a workpiece thereon; and a supporting mechanism for supporting said carrying member from a workpiece transfer position to a workpiece processing position, said supporting mechanism having a spring element and a magnet element; wherein, adjacent the workpiece processing position, the weight of said carrying member and a combined force of said spring element and said magnet element are approximately equal to each other, and wherein said magnet element has a magnet with a clearance which is smaller at the transfer position than at the workpiece processing position.

At a certain position, the clearance of the magnet of said magnet element may be smaller than that at the workpiece processing position, and at that position, the weight of said carrying member and the combined force of said spring element and said magnet element may be approximately equal to each other.

An absolute value of a changing rate of the force of said magnet element with respect to a change in clearance of the magnet, adjacent the workpiece processing position, may be set smaller than an absolute value of a changing rate or the force of said spring element with respect to a change in the clearance of the magnet.

In accordance with a still further aspect of the present invention, there is provided a supporting system, comprising: a carrying member for carrying a workpiece thereon; and a supporting mechanism for supporting said carrying member from a workpiece transfer position to a workpiece processing position, said supporting mechanism having a spring element and a magnet element; wherein, adjacent the workpiece processing position, the weight of said carrying member and a combined force of said spring element and said magnet element are approximately equal to each other, and wherein said magnet element has a magnet with a clearance which is larger at the transfer position than at the workpiece processing position.

At a certain position, the clearance of the magnet of said magnet element may be larger than that at the workpiece processing position, and at that position, the weight of said carrying member and the combined force of said spring element and said magnet element may be approximately equal to each other.

An absolute value of a changing rate of the force of said magnet element with respect to a change in clearance of the magnet, adjacent the workpiece processing position, may be set larger than an absolute value of a changing rate of the force of said spring element with respect to a change in the clearance of the magnet.

In accordance with a yet further aspect of the present invention, there is provided a supporting system, comprising: a carrying member for carrying a workpiece thereon; and a supporting mechanism for supporting said carrying member from a workpiece transfer position to a workpiece processing position, said supporting mechanism having a spring element and a magnet element; wherein an absolute value of a changing rate of the force of said magnet element with respect to a change in clearance of the magnet, adjacent the workplace processing position, is set smaller than an absolute value of a changing rate of the force of said spring element with respect to a change in the clearance of the magnet.

In accordance with a still further aspect of the present invention, there is provided a supporting system, comprising: a carrying member for carrying a workpiece thereon; and a supporting mechanism for supporting said carrying member from a workpiece transfer position to a workpiece processing position, said supporting mechanism having a spring element and a magnet element; wherein an absolute value of a changing rate of the force of said magnet element with respect to a change in clearance of the magnet, adjacent the workpiece processing position, is set larger than an absolute value of a changing rate of the force of said spring element with respect to a change in the clearance of the magnet.

In accordance with a still further aspect of the present invention, there is provided a supporting system, comprising: a carrying member for carrying a workpiece thereon; and a supporting mechanism for supporting said carrying member from a workpiece transfer position to a workpiece processing position; wherein, adjacent the transfer position, the weight of said carrying member and a force to be applied to said carrying member are substantially balanced, and wherein, adjacent the workpiece processing position, the weight of said carrying member and a force to be applied to said carrying member are substantially balanced.

The supporting mechanism may have a first element for producing a resisting force to a shift in a supporting direction, and a second element for producing a force for increasing the shift in the supporting direction.

The supporting mechanism may include a spring element and a magnet element.

In accordance with another aspect of the present invention, there is provided an exposure apparatus, comprising: a carrying member for carrying thereon a workpiece; and a supporting mechanism having a magnet, for supporting a weight of said carrying member; wherein a force to be applied to said magnet does not change with a shift of said carrying member along a plane perpendicular to a direction in which the weight is supported.

In accordance with a further aspect of the present inventions there is provided an exposure apparatus, comprising: a carrying member for carrying thereon a workpiece; and a supporting mechanism for supporting said carrying member, said supporting mechanism having an element for producing a force to increase/decrease a shift in a supporting direction, wherein, as the shift in the supporting direction increases, said carrying member is moved downwardly.

In accordance with a further aspect of the present invention, there is provided an exposure apparatus, comprising: a carrying member for carrying a workpiece thereon; and a supporting mechanism for supporting said carrying member from a workpiece transfer position to a workpiece processing position, said supporting mechanism having a first element for producing a resisting force to a shift in a supporting direction, and a second element for producing a force to increase a shift in the supporting direction.

In accordance with a still further aspect of the present invention, there is provided an exposure apparatus, comprising: a carrying member for carrying a workplace thereon; and a supporting mechanism for supporting said carrying member from a workpiece transfer position to a workpiece processing position, said supporting mechanism having a spring element and a magnet element; wherein, adjacent the workpiece processing position, the weight of said carrying member and a combined force of said spring element and said magnet element are approximately equal to each other, and wherein said magnet element has a magnet with a clearance which is smaller at the transfer position than at the workpiece processing position.

In accordance with a still further aspect of the present invention, there is provided an exposure apparatus, comprising: a carrying member for carrying a workpiece thereon; and a supporting mechanism for supporting said carrying member from a workpiece transfer position to a workpiece processing position said supporting mechanism having a spring element and a magnet element; wherein, adjacent the workpiece processing position, the weight of said carrying member and a combined force of said spring element and said magnet element are approximately equal to each other, and wherein said magnet element has a magnet with a clearance which is larger at the transfer position than at the workpiece processing position.

In accordance with a yet further aspect of the present intention, there is provided an exposure apparatus, comprising: a carrying member for carrying a workpiece thereon; and a supporting mechanism for supporting said carrying member from a workpiece transfer position to a workpiece processing position, said supporting mechanism having a spring element and a magnet element; wherein an absolute value of a changing rate of the force of said magnet element with respect to a change in clearance of the magnet, adjacent the workpiece processing position, is set smaller than an absolute value of a changing rate of the force of said spring element with respect to a change in the clearance of the magnet.

In accordance with a yet further aspect of the present invention, there is provided an exposure apparatus, comprising; a carrying member for carrying a workpiece thereon; and a supporting mechanism for supporting said carrying member from a workpiece transfer position to a workpiece processing position, said supporting mechanism having a spring element and a magnet element; wherein an absolute value of a changing rate of the force of said magnet element with respect to a change in clearance of the magnet, adjacent the workpiece processing position, is set larger than an absolute value of a changing rate of the force of said spring element with respect to a change in the clearance of the magnet.

In accordance with a still further aspect of the present invention, there is provided an exposure apparatus, comprising; a carrying member for carrying a workpiece thereon; and a supporting mechanism for supporting said carrying meter from a workpiece transfer position to a workpiece processing position: wherein, adjacent the transfer position, the weight of said carrying member and a force to be applied to said carrying member are substantially balanced, and wherein, adjacent the workpiece processing position, the weight of said carrying member and a force to be applied to said carrying member are substantially balanced.

In accordance with an aspect of the present invention, there is provided a device manufacturing method, comprising the steps of: preparing an exposure apparatus as recited above; applying a resist to a wafer; exposing the wafer by use of the exposure apparatus; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B show a fine-motion stage of a supporting system according to a first embodiment of the present invention, wherein FIG. 1A is a top plan view and FIG. 1B is a front view.

FIGS. 2A and 2Z show the fine-motion stage of a supporting system according to the first embodiment of the present invention, wherein FIG. 2A is a top plan view and FIG. 21 is a front view.

FIGS. 4A and 4B show a fine-motion stage of a supporting system according to a second embodiment of the present invention, wherein FIG. 4A is a front view and FIG. 4B is an enlarged and exploded view of the supporting unit thereof.

FIGS. 5A and 5B show a fine-motion stage of a supporting system according to a third embodiment of the present invention, wherein FIG. 5A is a front view and FIG. 5B is an enlarged and exploded view of the supporting unit thereof.

FIGS. 6A and 6B show a fine-motion stage of a supporting system according to a fourth embodiment of the present invention, wherein FIG. 6A is a top plan view and FIG. 6B is a front view.

FIGS. 7A and 7B show a fine-motion stage of a supporting system according to the fourth embodiment of the present invention, with a portion being demounted, wherein FIG. 7A is a top plan view and FIG. 7B is a front view.

FIGS. 8A and 8B show a first modified example of the fourth embodiment, wherein FIG. 8A is a top plan view and FIG. 8B is a front view.

FIGS. 11A and 11B show a fine-motion stage or a supporting system according to a fifth embodiment of the present invention, wherein FIG. 11A is a front view and FIG. 11B is an enlarged and exploded view of the supporting unit thereof.

FIGS. 12A and 12B show a modified example of the fifth embodiment of the present invention, wherein FIG. 12A is a front view and FIG. 12B is an enlarged and exploded view of the supporting unit thereof.

FIGS. 13A, 136 and 13C show a fine-motion stage of a supporting system according to a sixth embodiment of the present invention, wherein FIG. 13A is a top view, and FIGS. 13B and 13C are front views.

FIGS. 19A, 19B and 19C show a fine-motion stage of a supporting system according to a seventh embodiment of the present invention, wherein FIGS. 19A and 19B are front views and FIG. 19C is an enlarged and exploded view.

FIG. 21 is a front view, showing a second modified example of the seventh embodiment of the present invention.

FIGS. 29A and 29B show a fine-motion stage of a conventional supporting system, wherein FIG. 29A is a top plan view and FIG. 29B is a front view.

FIGS. 30A and 30B show a fine-motion stage of a conventional supporting system, wherein FIG. 30A is a plan view and FIG. 30B is a front view.

DESCRIPTION OF THE PREFERRED EMBODIMENTS

Preferred embodiments of the present invention will now be described with reference to the accompanying drawings.

Now, embodiments of the present invention will be described particularly in relation to a supporting system used in an exposure apparatus wherein a wafer is taken as a workpiece.

[First Embodiment]

Figure 1A:
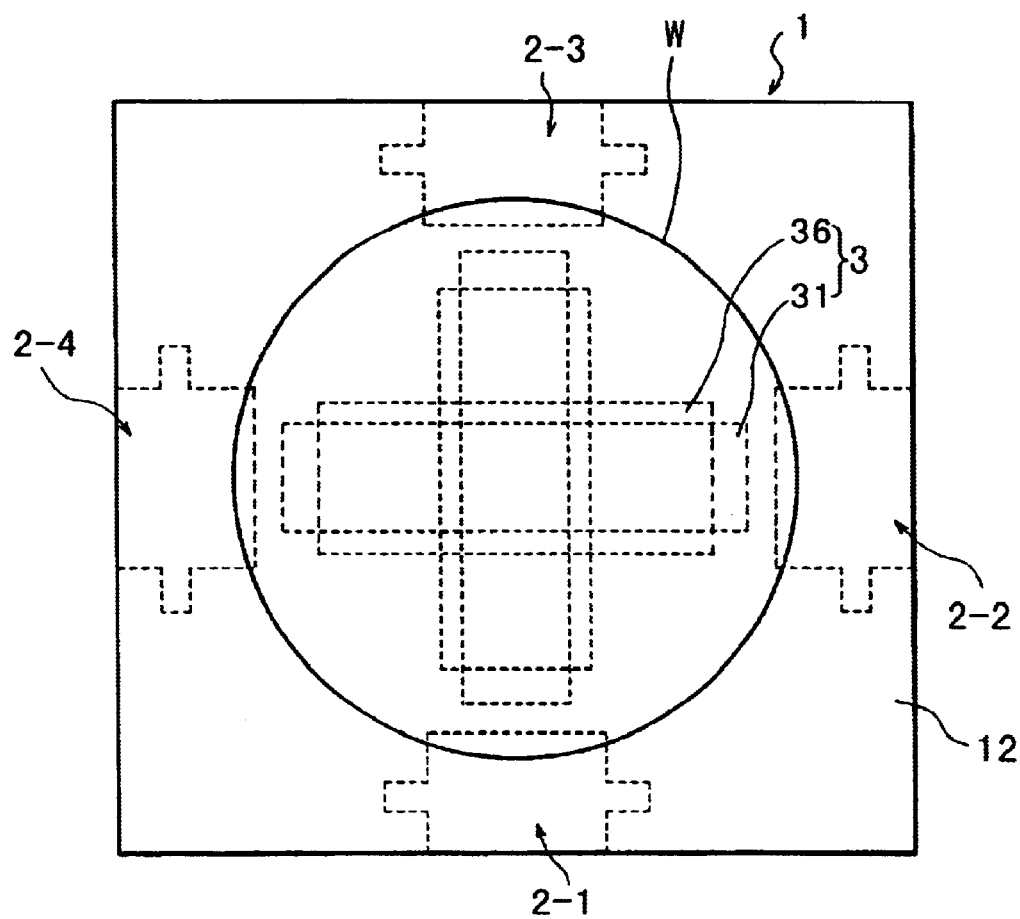
Figure 1B:
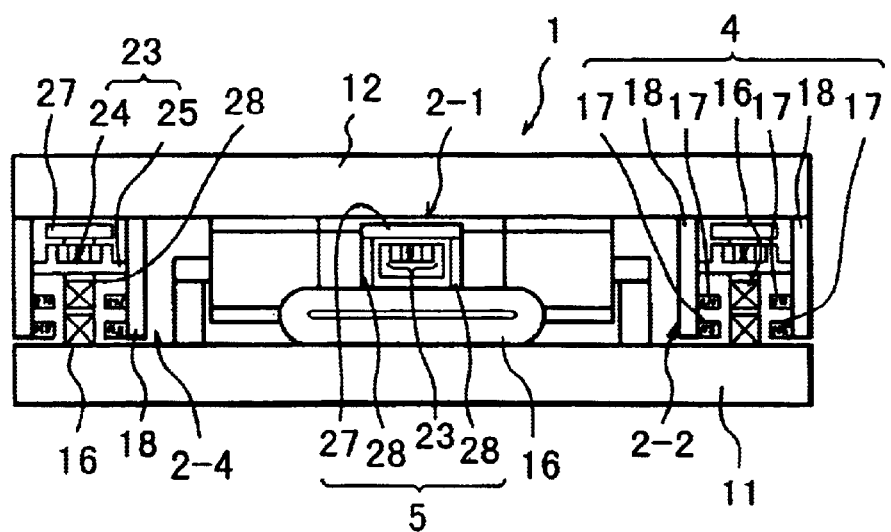
Figure 2A:
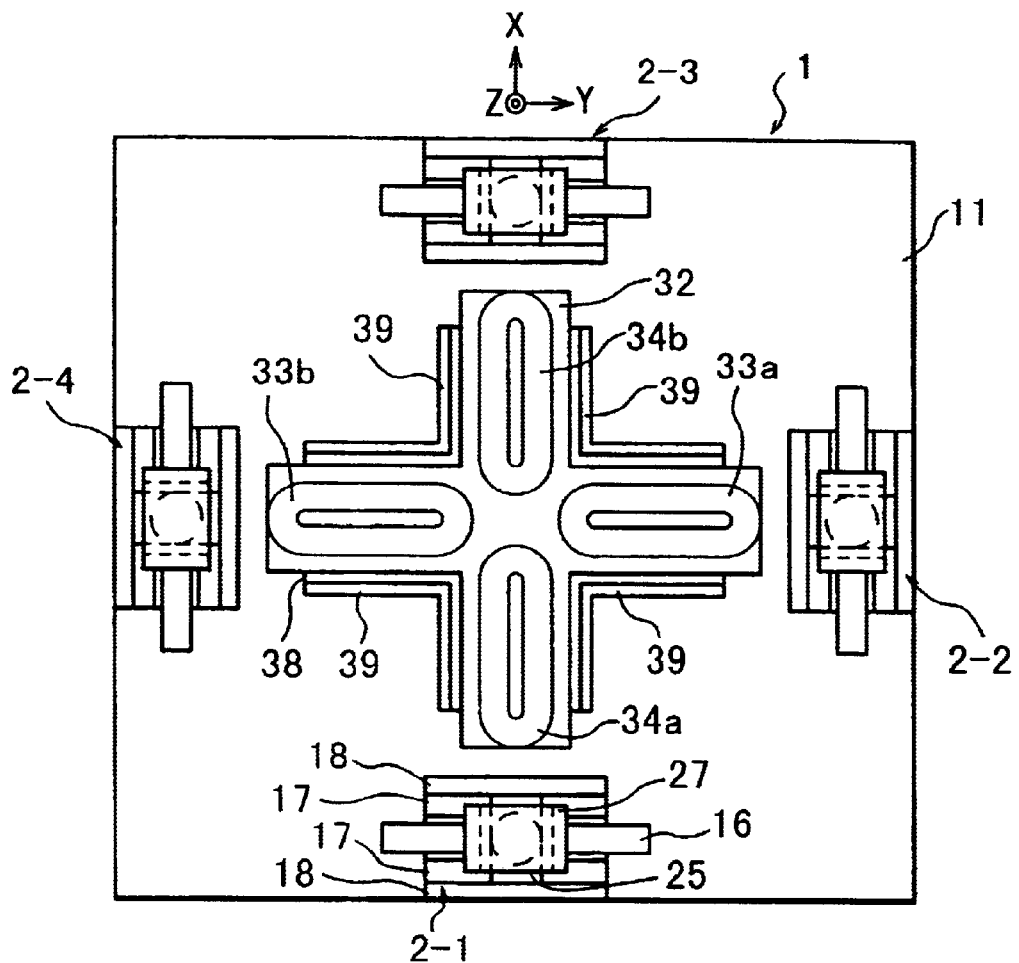
Figure 2B:
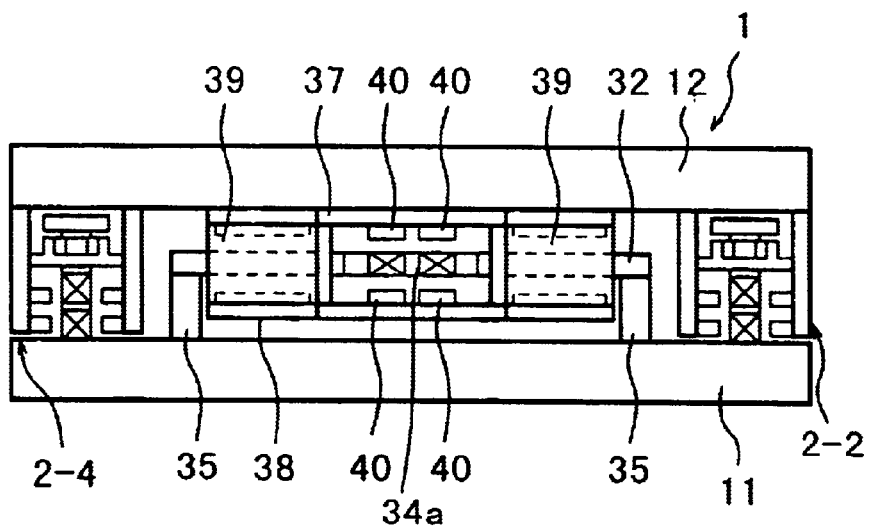

FIGS. 1A, 13, 2A and 2B show a fine-motion stage of a supporting system according to a first embodiment of the present invention, wherein FIG. 1A is a top plan view, FIG. 1B is a front view wherein a yoke of a Z linear motor is demounted, FIG. 2A is a top plan view wherein a wafer stage top plate is demounted, and FIG. 2B is a front view wherein a Z suspension driving unit 2-1 is demounted. The fine-motion stage 1 of the supporting system is mounted on an X stage top plate 11 and it functions to position a wafer W (workpiece) with respect to six axial directions of X, Y, Z, tilt and θ. By means of four Z suspension driving units 2-1 to 2-4 provided at the peripheral portion, a wafer stage top plate 12 (carrying meter) is supported and positioned with respect to Z tilt direction. Also, by means of an X-Y-θ driving unit 3 provided at the central portion, the wafer stage top plate 12 is positioned with respect to the X, Y and θ directions. The wafer stage top plate 12 carries thereon a water which is to be positioned.

The Z suspension driving unit 2 (2-1 to 2-4) includes a Z linear motor 4 and a weight supporting mechanism 5. The Z linear motor functions to apply a force in Z direction to the wafer stage top plate 12. The weight supporting mechanism 5 operates to support the weight of the wafer stage top plate 12, and functions at least to intercept transmission of vibration in a direction along a plane of a pattern.

The Z linear motor 4 comprises a flat coil 16 having a major or lengthwise side parallel to a horizontal line, four magnets 17 opposed, through a gap, to the major side of the flat coil 16, and two yokes 18 for circulating the magnetic flux of the magnets 17. The flat coil 16 is fixed to the X stage top plate 11, and the magnets 17 and the yokes 18 are fixed as a unit to the wafer stage top plate 12. As an electric current is applied to the flat coil 16, a force in the Z direction operates between the coil 16 and the integral structure of the magnet 17 and the yoke 18.

Figure 3:
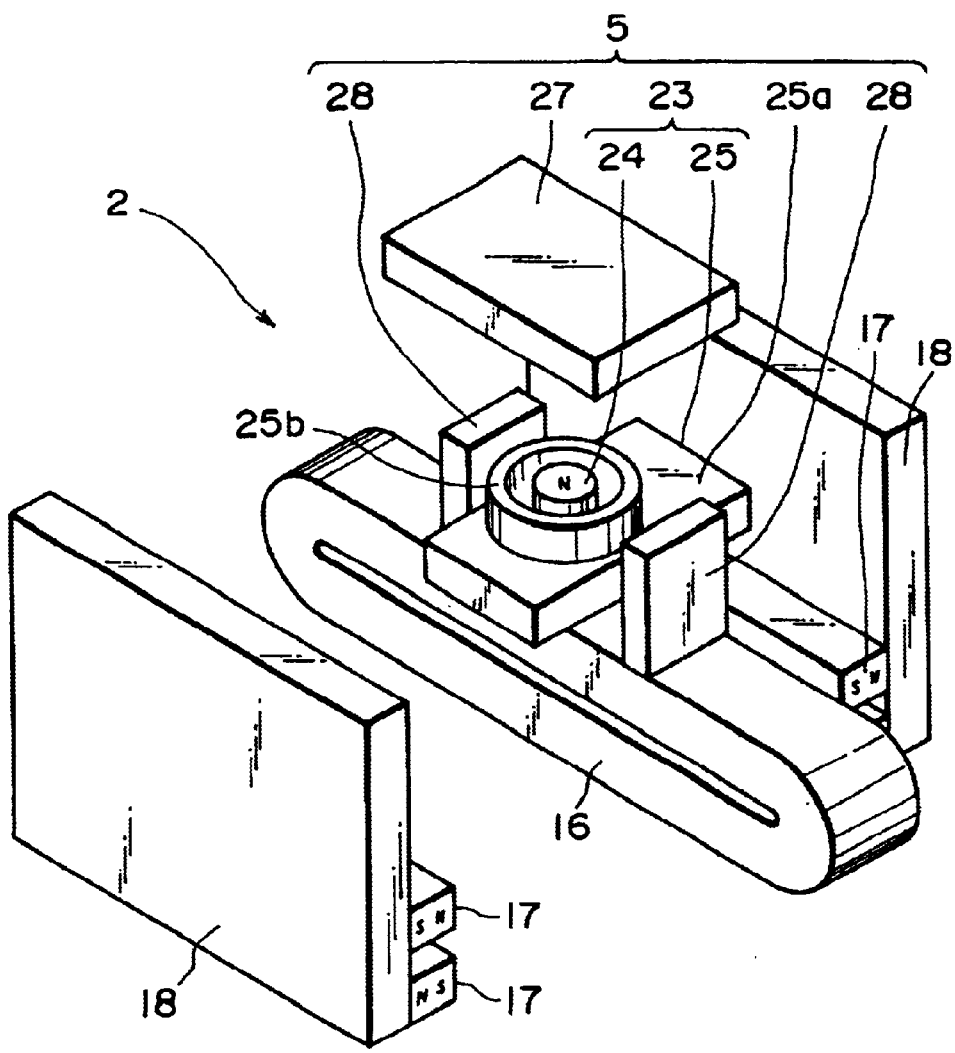
FIG. 3 is an exploded perspective view of a supporting unit in the supporting system according to the first embodiment of the present invention.

The weight supporting mechanism 5 comprises an attraction magnet 23, a lifting iron plate 27 to be attracted by the magnet 23, iron plate supporting members 28 for supporting opposite ends of the iron plate 27 (details are shown in FIG. 3). The magnet 23 comprises a column-like magnet element 24 being magnetized vertically, and a yoke 25 for circulating the magnetic flux of the magnet element 24. The yoke 25 is a magnetic member such as iron, for example, having a ring-like protrusion 25b formed on its flat portion 25a. The magnet element 24 is fixed at the central portion of the ring-like protrusion 25b of the yoke 25. Here, the weight to be supported by the weight supporting mechanism 5 includes the weights of the magnet 17, yoke 18 and magnet 23, movable as a unit with the water stage top plate 12. This applies to other embodiments to be described later.

As regards the coupling relation, the opposite ends of the flat plate 25a of the yoke 25 are fixed to the linear motor yoke 16, and the iron plate 27 are fixed to the flat coil 16 of the Z linear motor 4 through the two iron plate supporting members 28. As a result, the magnet element 24 of the attracting magnet 23 and the iron plate 27 are disposed opposed to each other with a small clearance kept therebetween, such that an attraction force operates between them. The iron plate 27 is fixed to the X stage top plate 11 through the supporting members 28 and the flat coil 16 of the Z linear motor 4, and the attracting magnet 23 is fixed to tile wafer stage top plate 12 through the linear motor coil 18. Thus, with an attraction force acting between the magnet 23 and the iron plate 27, the wafer stage top plate 12 receives an attraction floating force from the X stage top plate 11. In order that an attraction floating force operates from the X stage top plate 11, disposed below, to the wafer stage top plate 12 disposed above, as shown in FIG. 3, a telescopic structure wherein the magnet element 24 is placed inside is used.

The size along a plane perpendicular to the attracting direction of the iron plate 27 is made larger by at least a few centimeters than that of the ring-like protrusion 25b of the attracting magnet 23. Alternatively, it is made sufficiently large as compared with the gap or clearance between the magnet 23 and the iron plate 27. With this arrangement, even if the attracting magnet 23 and the iron plate 27 shift along a plane perpendicular to the attracting direction, the resisting force (resilience force) there of in the shift direction can be made substantially zero. This is because the size along a plane perpendicular to the attracting direction of the iron plate 27 is made slightly larger, a shift in that direction causes substantially no change in the boundary condition of the magnetic lines of force produced between the attracting magnet 23 and the iron plate 27, such that there occurs substantially no change in the distribution of magnetic lines of force. Thus, the supporting portion car be free along that plane.

The Z linear motor 4 does not bear the function of weight support but it operates solely for the position control. Thus, an electric current which may otherwise cause a problem of heat generation is not flown thereto. This is as like the conventional structure described above.

As shown in FIGS. 1A, 2A and 2B, the X-Y-θ driving unit 3 comprises a cross-shaped stator 31 and a cross-shaped movable element 36. The stator 31 has X coils 33a and 33b and Y coils 34a and 34b which are inserted into a cross-shaped frame 32. It is fixed to the X stage top plate 11 through a frame supporting member 35. The movable element 36 has a cross-shaped upper yoke 37, a cross-shaped lower yoke 38, for L-shaped side plates 39, and four (upper two and lower two) magnets 40. Upon the upper and lower yokes 37 and 38, the magnets 40 are disposed at positions to be opposed to the corresponding coils 33a, 33b, 34a and 34b of the stator 31. By using the side plates 39 as a spacer, the upper and lower yokes 37 and 38 are combined to vertically sandwich the stator 31 therebetween, and the resultant integral structure is fixed to the wafer stage top plate 12. The lengthwise side of each X coils 33a and 33b is disposed at a right angle to the X direction, while the lengthwise side of each Y coils 34a and 34b is disposed at a right angle with the Y direction. As an electric current is flown to the X coils 33a and 33b, a force in X direction is produced between the stator 31 and the movable element 36. Also, as an electric current is applied to the Y coils 34a and 34b, a force in the Y direction is produced between the stator 31 and the movable element 36. Further, a moment in θ direction can be produced by superposing couple components by means of the X and Y coils 33a–34b.

In this embodiment, the Z linear motor may be conventional. Although use of three motors is enough, there are four motors used. This is to provide symmetry in the whole geometrical shape and to assure geometrical symmetry in the linear motor disposition, thereby to make it easy to push the gravity center by fine-motion linear motors. Further, since two linear motors 4 are disposed along the X driving axis while other two are disposed along Y driving axis, independent control of the moment about the X axis and the moment about the Y axis is easy. However, use of three-motor driving system as conventional may be adopted, with an effect of interception of vibration along a plane perpendicular to the supporting direction, although the advantages described above are not obtainable.

As regards the X-Y-θ driving system, while use of three motors is enough, there are four motors used, particularly for the geometrical symmetry. In the X-Y-θ driving system, the easiness of pushing the gravity center or independent controllability for respective axes are substantially unchanged by use of the three-motor system, as like the example to be described with reference to FIG. 8. Therefore, a three linear motor structure may be used in the X-Y-θ driving unit, such as shown in FIG. 8.

With the structure described above, a wafer W can be positioned precisely with respect to X, Y, Z, θ and tilt directions, by applying appropriate electric currents to coils of the rough-motion X, rough-motion Y, fine-motion X1, fine-motion X2, fine-motion Y1, fine-motion Y2, fine-motion Z1, fine-motion Z2, fine-motion Z3, and fine-motion Z4, through a control system (not shown). Then, an exposure process is performed by using exposure means (not shown), a pattern of an original (not shown) in sequentially printed on the wafer W. Here, any vibration disturbance to be transmitted to a plane perpendicular to the weight supporting direction, is blocked by the freedom of the attracting magnet 23 along that plane, such that the position control precision is improved significantly.

[Second Embodiment]

Figure 4A:
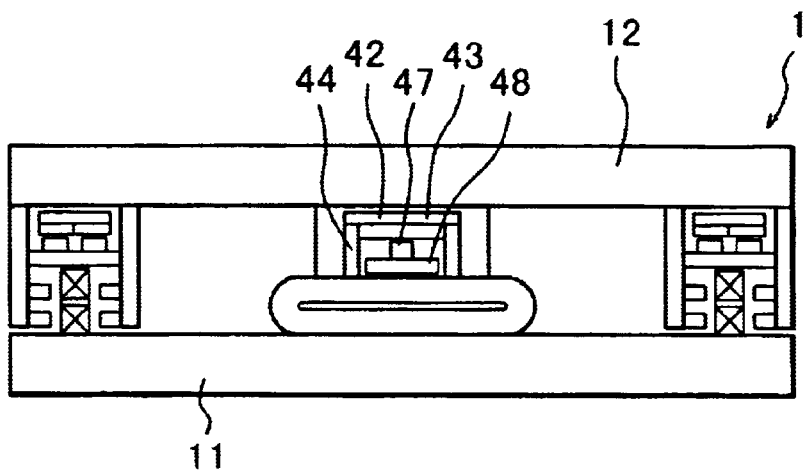
Figure 4B:
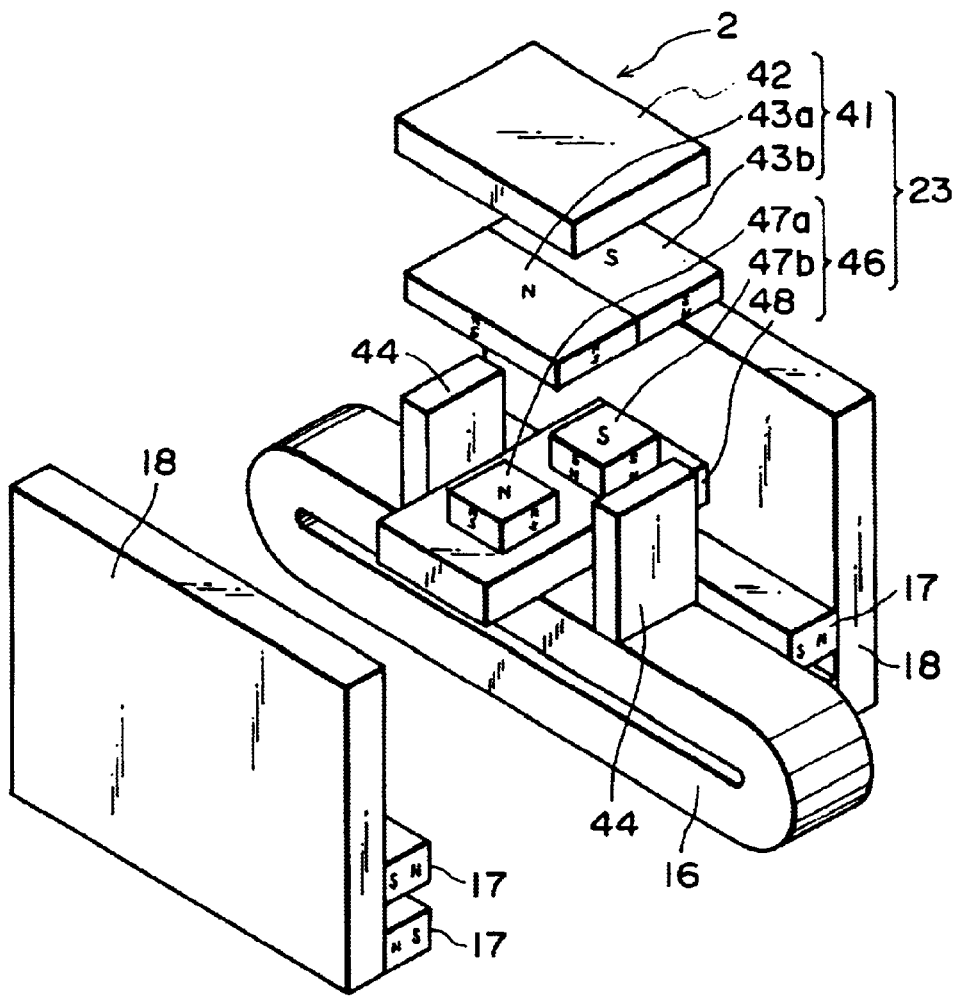

FIGS. 4A and 4B show a fine-motion stage of a supporting system according to a second embodiment of the present invention, wherein FIG. 4A is a front view In a state in which a yoke in front of a z linear motor is demounted, and FIG. 4B is an enlarged perspective view of that portion. In the fine-motion stage 1 of this supporting system, the lifting iron plate 27 of the first embodiment is replaced by an upper magnet unit 41 having an upper yoke 42 and upper magnets 43a and 43b. Also, the attracting magnet 23 of the first embodiment is replaced by a lower magnet unit 46 which comprises lower magnets 47a and 47b as well as a lower yoke 48. The upper magnets 43a and 43b and the lower magnets 47a and 47b are magnetized so that they attract each other. In the first embodiment, the combination of the ion plate 27 and the magnet 23 is used to assure the attracting function as well as the freedom (release) along the plane perpendicular to the attracting direction. In this embodiment, similar functions are provided by placing, opposed to each other, the upper and lower magnets 43 and 47 of rectangular shape and having different sizes. Even with magnets solely, if there is a difference maintained between them in respect to the size along a plane perpendicular to the attracting direction, it is possible to assure that a shift along the plane perpendicular to the attracting direction does not cause a substantial change in the distribution of magnetic lines of force. Therefore, like the first embodiment, any vibration along a plane perpendicular to the attracting direction can be intercepted.

In the fine-motion stage 1 of this embodiment, the lower magnet unit 46 is fixed to the wafer stage top plate 12 disposed above, while the upper magnet unit 41 is fixed to the X stage top plate 11 disposed below. With the support through a telescopic structure including the upper magnet support, a floating force is applied from the lower X stage top plate 11 to the upper wafer stage top plate 12. This is the same as the first embodiment. The six-axis fine-motion mechanism itself is of the same structure as has been described with reference to the first embodiment.

[Third Embodiment]

Figure 5A:
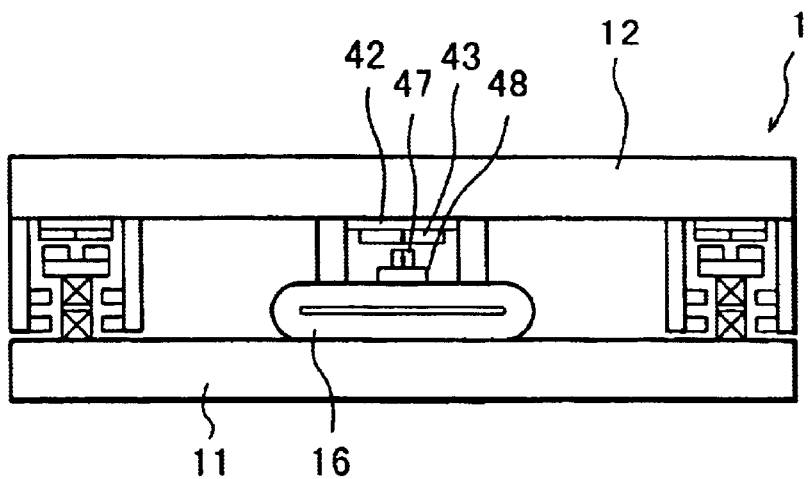
Figure 5B:
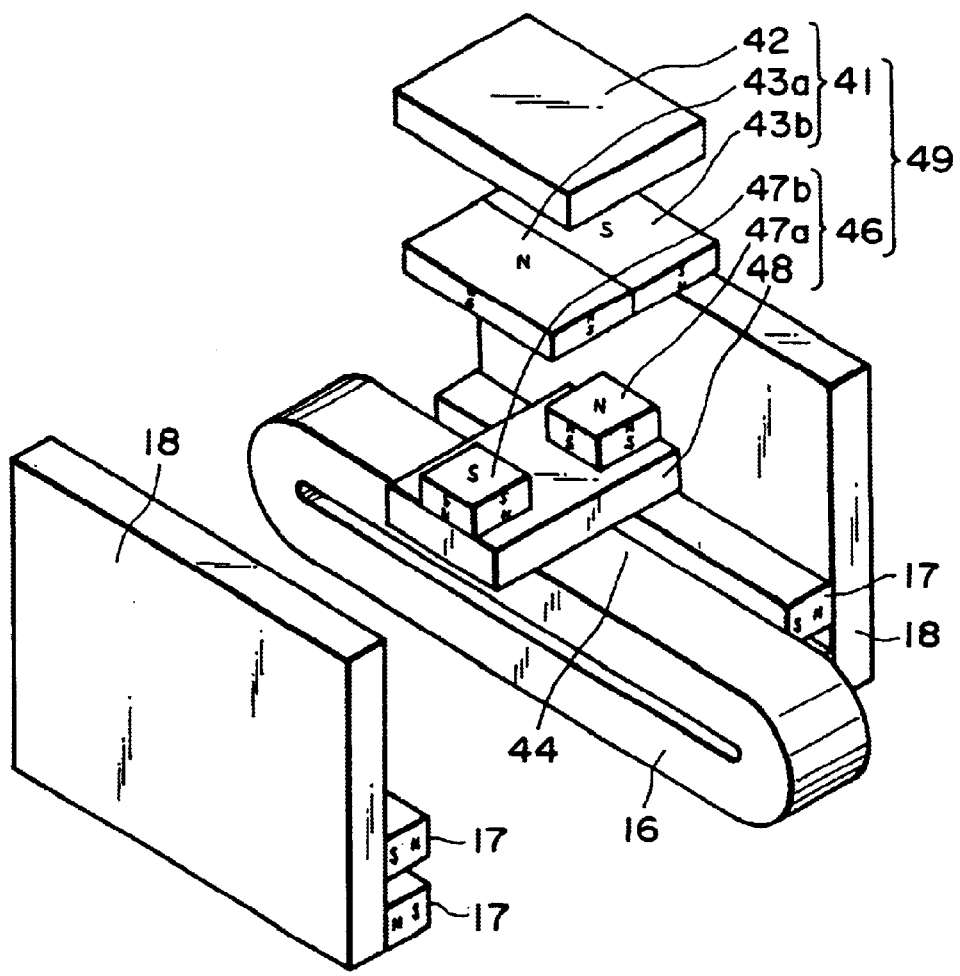

FIGS. 5A and 5B show a fine-motion stage of a supporting system according to a third embodiment of the present invention, wherein FIG. 5A is a front view in a state in which a yoke in front of a Z linear motor is demounted, and FIG. 5B is an enlarged perspective view of that portion. In the fine-motion stage 1 of this embodiment, the magnet structure is similar to that of the second embodiment, and it comprises an upper magnet unit 41 having an upper yoke 42 and upper magnets 43a and 43b, as well as a lower magnet unit 46 having lower magnets 47a and 47b and a lower yoke 48. There is a difference held between them, in respect to the size along a plane perpendicular to the floating force producing direction. This embodiment differs from the second embodiment in that the upper magnets 43a and 43b and the lower magnets 47a and 47b are magnetized so as to produce a mutually repulsion forces and thus a repulsive magnet unit 49 is provided. The coupling relation of these magnets is inverse to that of the second embodiment. The lower magnet unit 46 is fixed to a flat coil 16 of the Z linear motor 4 through the lower yoke 48, while the upper magnet unit 41 is fixed to the wafer stage top plate 12 through the upper yoke 42. Since a repulsion force operates to them, a telescopic structure as used in the second embodiment is not necessary. By simply fixing the magnets to the top plates 12 and 11, respectively, a floating force can be applied from the X stage top plate 11 to the wafer stage top plate 12. Thus, the structure is simple as compared with the second embodiment. Even with use of repulsive magnets, if a difference is created in the size along a plane perpendicular to the repulsion direction, a mutual shift between them along that plane does not cause a substantial change in the distribution of magnetic lines of force. Thus, like the first embodiment, any vibration along a plane perpendicular to the floating direction can be intercepted. The six-axis fine-motion mechanism itself is the same as in the first embodiment.

[Fourth Embodiment]

Figure 6A:
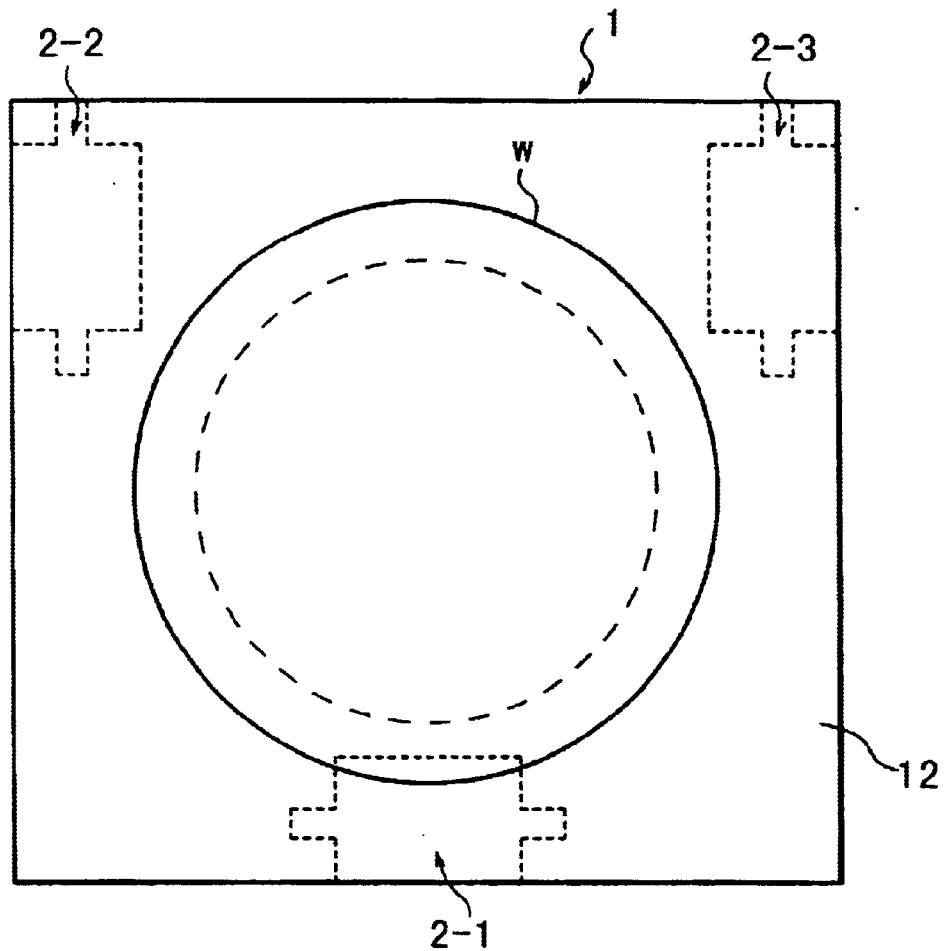
Figure 6B:
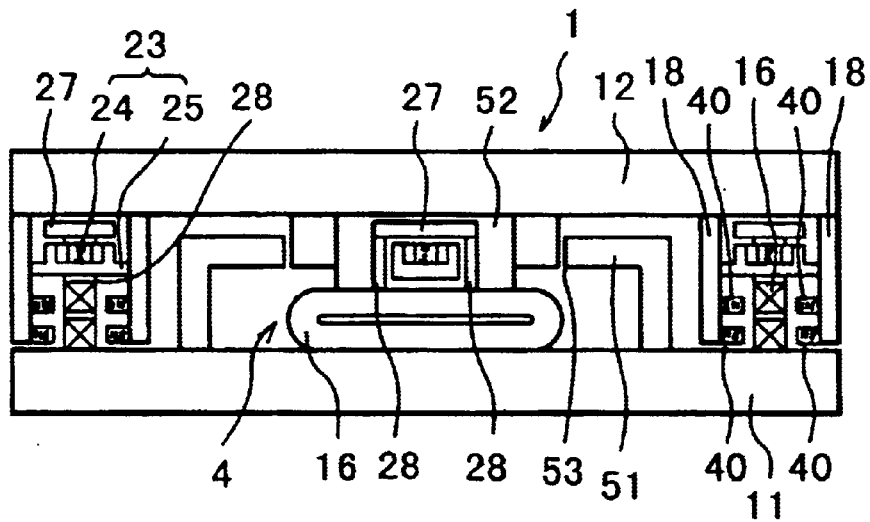
Figure 7A:
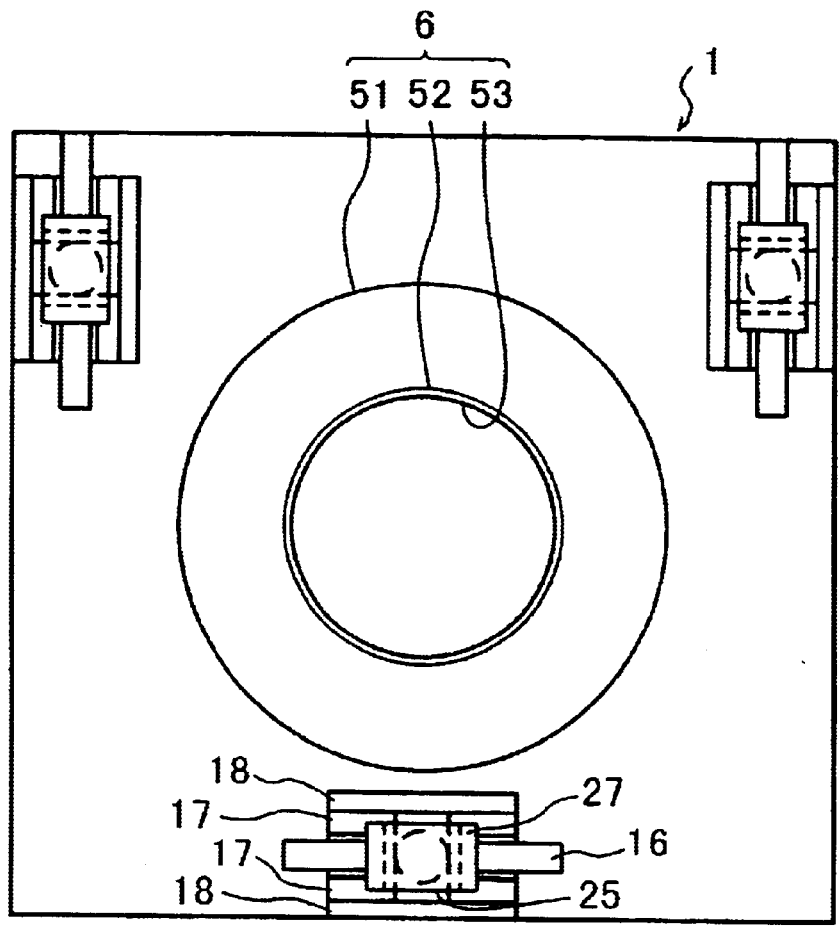
Figure 7B:
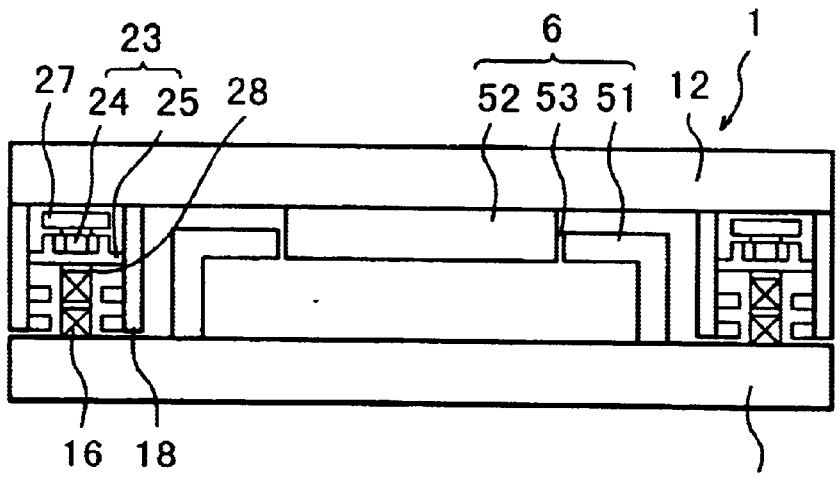

FIGS. 6A, 6S, 7A and 7B show a fine-motion stage of a supporting system according to a fourth embodiment of the present invention, wherein FIG. 6A is a top view, FIG. 6B is a front view in a state in which a yoke in front of a Z linear rotor is demounted, FIG. 7A is a top view in which a wafer stage top plate is demounted, and FIG. 7B is a front view. In which a front Z suspension driving unit is demounted.

The fine-motion stage 1 of this embodiment is mounted on an X stage top plate 11 and it functions to position a wafer W (workpiece) with respect to Z tilt θ direction. While guides and driving systems thereof are conventional, there are Z suspension driving units 2 (2-1 to 2-3) as used in the first embodiment of FIGS. 1–3, disposed at three locations and, additionally, there is a universal joint 6 at the center. This differs from the first embodiment. The universal joint 6 comprises an outer circular ring 51 fixed to the top face of the X stage top plate 11, and an inner circular ring 52 disposed inside the outer ring 51 and fixed to the bottom face of the wafer stage top plate 12. There is an air between the outer and inner rings 51 and 52, and the universal joint 6 functions to relatively guide the X stage top plate 11 and the wafer stage top plate 12, while confining relative shift in x and Y directions, to enable rotation, Z axis motion and Z tilt.

The Z linear motors 4 of the Z suspension driving unit 2 (2-1 to 2-3) as well as the weight supporting mechanism 5 are of the same structure as of the first embodiment. Duplicate description is omitted, by assigning the same reference numerals to corresponding components. The Z linear motor 4 does not bear the function of weight support but it operates solely for the position control. Thus, an electric current which may otherwise cause a problem of heat generation is not flown thereto. This is the same as the first embodiment.

With the structure described above, a wafer W can be positioned precisely with respect to X, Y, Z, θ and tilt directions, by applying appropriate electric currents to coils of the rough-motion X, rough-motion Y, fine-motion X1, fine-motion X2, fine-motion Y1, fine-motion Y2, fine-motion Z1, fine-motion Z2, fine-motion Z3, and fine-motion θ, through a control system (not shown). Then, an exposure process is performed by using exposure means (not shown), a pattern of an original (not shown) is sequentially printed can the wafer W.

Here, any vibration disturbance to be transmitted to a plane perpendicular to the weight supporting direction, is blocked by the freedom of the attracting magnet 23 along that plane, such that the position control precision is improved significantly. Further, since this embodiment does not use an air or rubber film, the reliability is improved.

Figure 8A:
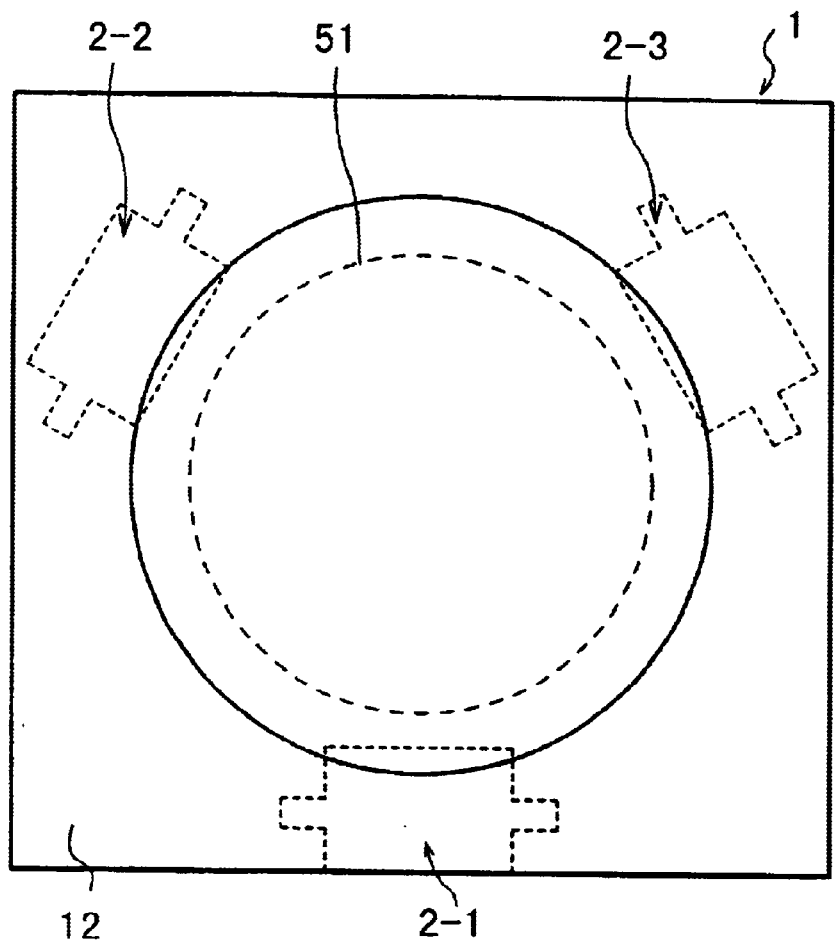
Figure 8B:
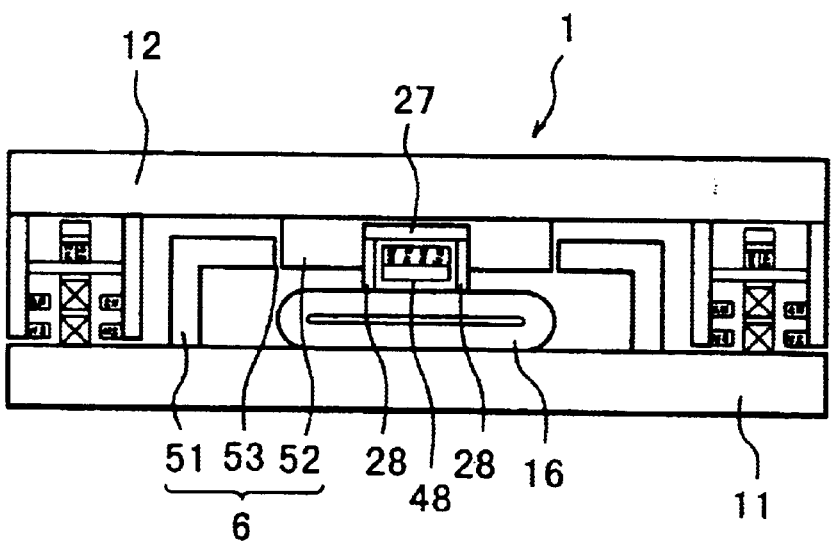
Figure 9:
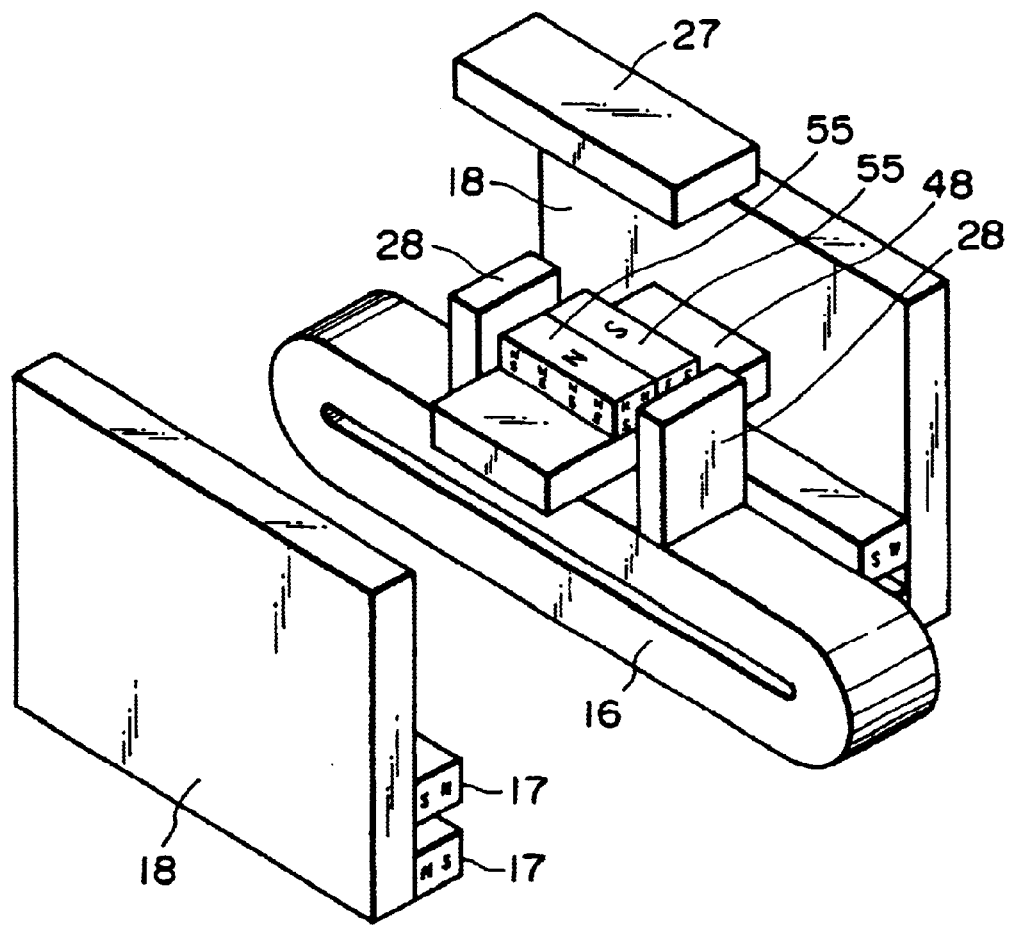
FIG. 9 is an enlarged perspective views of a portion of FIG. 8.

FIGS. 8A, 8E and 9 show a first modified example the attraction magnet unit in the fourth embodiment of the present invention, wherein FIG. 8A is a top plan view, FIG. 8B is a front view and FIG. 9 is a perspective view In the fourth embodiment shown in FIGS. 6 and 7, the system is so structured that a shift of the magnet and the iron plate in any direction does not apply a substantial resisting force (resilience force) in the shift direction. In this modified example, however, the shift direction in which the resisting force does not apply is restricted to one direction. In the example of FIG. 3, the column-like magnet element 24 is fixed to the yoke 25 having a ring-like protrusion 25b, and this yoke 25 is fixed to the linear motor yoke 18 which is integral with the wafer stage top plate 12. In this modified example, as compared therewith, two rectangular parallelepiped magnets 55 are fixed to a flat plate-like yoke 48, and this yoke 48 is fixed to a linear motor yoke 18 which is integral with the wafer stage top plate 12. The two magnets 55 are vertically magnetized, respectively, and one is mounted so its N pole faces up and the other is mounted so that its S pole faces up. A floating force is applied to the magnets 55 from the iron plate 27 to float the wafer stage top plate 12, this being the same as in the example of FIG. 3.

A largest difference of this embodiment over the FIG. 3 example is that the sizes of the iron plate 27 and the two magnets 55 as a whole, along the place perpendicular to the floating force direction, are different only in one direction. In the FIG. 3 example, the size of the iron plate 27 in the direction perpendicular to the floating force is generally larger than the diameter of the ring-like protrusion 25b of the yoke 25, so that, even if the magnet 23 shifts in any direction relative to the iron plate 27, a resisting force does not substantially apply. In the present modified example, as compared therewith, as regards the size in the direction perpendicular to the floating force of the iron plate 27, it is larger than the two magnets 55 as a whole in respect to the direction along the lengthwise direction of the flat coil 16, whereas it is approximately the same as the size of the two magnets 55 in respect to a direction normal to the lengthwise direction. As a result of this, if the magnet 55 shifts relative to the iron plate 27 in the direction along the lengthwise direction of the flat coil 16, substantially no resilience force operates. However, if the shift is in any other direction, a large resilience force is applied.

The Z Suspension driving unit 2 (2-1 to 2-3) comprising the Z linear motors 4 and the weight supporting mechanism 5, is disposed along the circumferential direction of the universal joint 6, as shown in FIG. 8.

With this arrangement, due to the confining action of the universal joint 6, the magnets 55 and the iron plate 27 move only in the circumferential direction of the universal joint 6. Namely, they shift only in the direction in which a resilience force does not operate in response to the shift. In other words, even if a resilience force operates as the shift occurs in any other direction, practically, there occurs no shift in such direction.

When the margin for the size of the iron plate 27 with respect to the magnet 55 is limited only to one direction, it saves the space for any other directions. Therefore, the mass or space can be saved advantageously.

Figure 10:
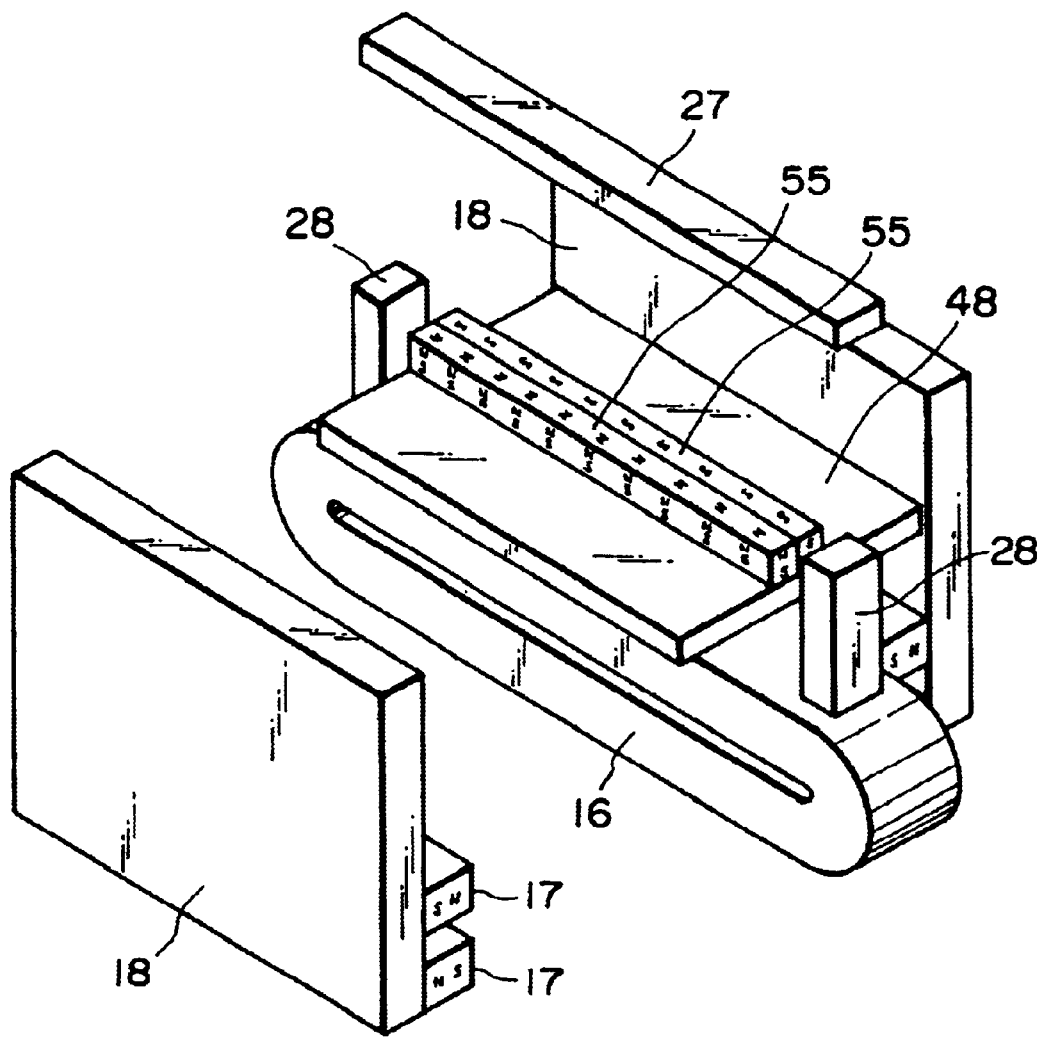
FIG. 10 is an enlarged perspective view, showing a second modified example of the fourth embodiment of the present invention.

FIG. 10 show a second modified example of the attracting magnet unit in the fourth embodiment of the present invention. While the basic structure is the same as the first modified example shown in FIGS. 8 and 9, in this example the size of the magnet 55 in the direction along the lengthwise direction of the flat coil 16 are further enlarged, and the size in the direction perpendicular to that direction is made shorter. Since the floating force is proportional to the area with which the magnet 55 and the iron plate 27 are opposed to each other, once the area is kept constants the floating force can be maintained even though the aspect ratio of the parallelepiped is changed.

In the example shown in FIG. 10, the Z suspension driving unit 2 is disposed so that the direction in which the resilience force does not substantially operate is put along the circumferential direction of the universal joint 6, such that, due to the confinement by the joint 6, the shift can occur only in the direction in which substantially no resilience force operates. The difference over the first modified form of FIG. 9 is that, as compared with the first modified example, in the second modified example the resilience force against the shift in the direction along the lengthwise side of the flat coil 16 is further smaller, and that a large resilience force applies, to the contrary, in response to a shift in the direction perpendicular to the lengthwise direction. This is because the width of the region in which the magnetic field changes in response to a shift along the lengthwise direction of the flat coil 16 is proportional to the magnet size in the direction perpendicular to the coil lengthwise direction. As compared with the first modified example of FIG. 9, in the second modified example the magnet size in the direction perpendicular to the length of the flat coil 16 is smaller. Therefore, in response to a shift in the lengthwise direction of the flat coil 16, the region of magnetic field change is narrower in this example than in the first modified example, such that the energy change is smaller.

Even if the size ratio of the magnet 55 is changed, similarly, due to the confinement of the universal joint 26, the magnet 55 and the iron plate 27 can shift only in the e direction of the wafer top plate 12. Since the resilience force responsive to the shift in that direction becomes further smaller, the vibration interception performance of the wafer stage top plate 12 in the θ direction is improved. Alternatively, this characteristic may be used to reduce the margin of size of the iron plate 27, without using the Same for the performance increase. Although the resilience force becomes larger as the margin size of the iron plate to the magnet 55 in the shift direction becomes smaller, since the resilience force can be reduced if the magnet size in the direction perpendicular to the shift direction is set small. Thus, in total, without increase of the resilience force, namely, without degrading the vibration interception performance, the margin of size of the iron plate 27 with respect to the magnet can be reduced.

In the first and second modified examples of FIGS. 9 and 10, the N and S poles are disposed along the widthwise direction of the magnet 55 As a result, as the absolute value of the short size becomes smaller, the depth of penetration of the magnetic flux of the magnet 55 into the yoke 48 below and the iron plate 27 above becomes shallower. Thus, the smaller the absolute value of the short size is, the thinner the thickness of the yoke 48 below and the iron plate 27 above can be. The total height can therefore be reduced. This is an advantageous result, obtained by restricting the freedom of resilience force along a plane into the freedom only in a single direction.

In summary, in the first and second modified examples of FIGS. 9 and 10, a particular one direction is distinguished over the other directions and the freedom in the particular direction is enhanced, by which the freedom in that direction, namely, the vibration intercepting characteristic, can be improved. Also, without degrading the vibration isolating property, the margin in size of the iron plate 27 relative to the magnet 55 can be reduced, and the total height can be made smaller.

In the fourth embodiment, like the example shown in FIG. 1, four Z suspension driving units 2 may be used In the example of FIG. 8, there are three Z suspension driving units 2 (2-1 to 2-3) disposed along the circumferential direction. However, in this example, four units may be used and disposed so that the direction in which substantially no resilience force operates is put along the circumferential direction of the universal joint 6. The freedom to be controlled concerns Z direction and tilt, and use of three driving units is enough. However, four units may be used. In that occasion, geometrical symmetry is assured with respect to both the X and Y directions and, therefore, the gravity center and the action point can easily be registered with each other. Further, in the tilt driving, the influence of any other component can be minimized.

What is important in this structure is that the direction in which no resilience force acts is registered with the circumferential direction of the universal joint 6. Any other component such as, for example, the lengthwise direction of the flat coil 16, is not important. Namely, while in the fourth embodiment the lengthwise direction of the magnet 55 is put in the same direction as the lengthwise side of the flat coil 16, they may be different from each other. However, where the aspect ratio of the size of the magnet 55 largely differs as shown in FIG. 10, registering the lengthwise directions of the magnet and the coil will be advantageous in respect to the space saving.

[Fifth Embodiment]

Figure 11A:
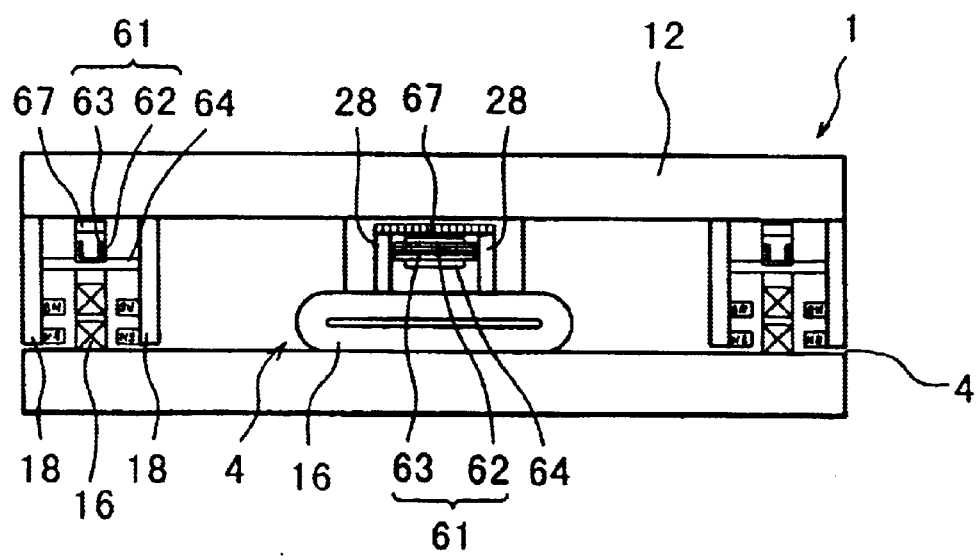
Figure 11B:
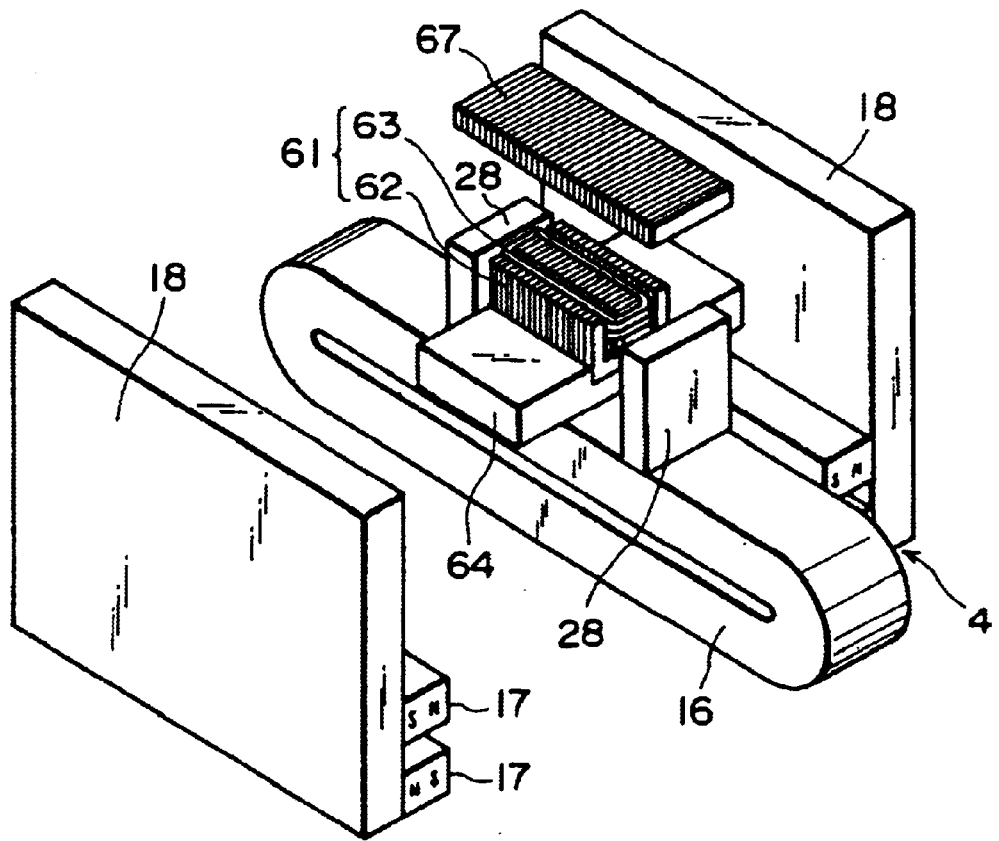

FIGS. 11A and 11B show an attraction magnet unit in a fifth embodiment of the present invention, wherein FIG. 11A is a front view in a state in which a yoke in front of a Z linear motor is demounted, and FIG. 11B is an enlarged perspective view of that portion. In the fourth embodiment and the first and second modified forms thereof, the combination of an iron plate and a magnet is used to assure the attracting function as well as the freedom (release) along the plane perpendicular to the attracting direction. In this embodiment, similar functions are provided by use of a combination of an iron plate and an electromagnet. The electromagnet can produce a large attracting force with a very small ampere turn, as contrasted to the linear motor and, therefore, a condition without a large heat generation can be set in such use as the weight support wherein continuous energization is required. Thus, it can be used in place of a permanent magnet.

The attraction magnet unit in this embodiment comprises an electromagnet 61 having a coil 63 wound around the central portion of a laminated yoke 62 having an approximately E-shaped section, and a laminated lifting iron plate 67 having an approximately I-shaped section and being disposed opposed to the electromagnet 61. In response to an electric current flown to the coil 63 at the center of the yoke 62, an attraction force is produced between them. The electromagnet 61 disposed below is fixed to the wafer stage top plate 12 disposed above, through an electromagnet holder 64 and the yoke 18. The iron plate 67 disposed above is fixed to the flat coil 16 through an iron plate supporting member 28.

At the plane as opposed, the size of the iron plate 67 in the plane perpendicular to the attracting direction and specifically along the lengthwise direction of the flat coil 16, is made larger than the electromagnet 61. The size in the direction perpendicular to that direction is approximately the same as the electromagnet 61.

Thus, when an electric current is flown through the coil 63 at the center of the yoke 62 to produce an attraction force between the electromagnet 61 and the iron plate 67, the distribution of the magnetic lines of force does not substantially change even if a shift occurs in a direction along the length of the flat coil 16 under similar conditions as those of the first and second modified examples of the fourth embodiment as a result, vibration in the direction along the length of the coil 16 can be blocked, as in the first and second examples of the fourth embodiment. On the other hand, any vibration in a direction perpendicular to that direction is relatively transmitted. The Z suspension driving unit 2 is disposed so that the direction in which the vibration is blocked is placed along the circumferential direction of the universal joint 6, as shown in FIGS. 8, 9 and 10. As a result, like the fourth embodiment and the first and second modifications thereof, vibration in θ direction to the wafer stage top plate 12 can be intercepted.

Further, as regards the electromagnet 61, as in the examples of FIGS. 8, 9 and 10, the vibration blocking performance is improved with a larger difference in longitudinal and lateral sizes of the surface opposed to the iron plate 67. Also, the margin of size can be saved without degrading the vibration blocking performance.

The magnetic poles as formed by the electromagnet 61 of FIG. 11 are disposed along a widthwise (minor) direction of the opposed area with the iron plate 67. For example, if there is an N pole at the center of the yoke 62, there are S poles at the opposite ends. If there is an S pole at the center, there are N poles at the opposite ends. Therefore, in the same condition as described in relation to FIGS. 9 or 10, with a smaller absolute value of the short (width) size, the depth of penetration of the magnetic flux into the lower portion of the yoke 62 or iron plate 67 can be made smaller. This enables reduction in thickness of the ion plate 67 and yoke 62, and also reduction in total height.

Also in the case of the electromagnet 61, by confining the freedom in a particular one direction, the vibration intercepting characteristic can be improved. Also, without degrading the vibration isolating property, the margin in size of the iron plate 67 relative to the electromagnet 61 can be reduced, and the total height can be made smaller.

As a matter of course, the electromagnet 61 may be used without any limitation to the vibration blocking direction, as in the example of FIG. 3.

There is an advantage peculiar to the electromagnet 61. By adjusting the electric current, the floating force of the wafer stage top plate 12 can be adjusted. If a permanent magnet is used, the adjustment of the floating force or repulsion force needs adjustment of changing the gap, and this need a specific mechanism. In the case of the electromagnet 61, on the other hand, only changing the electric current is necessary. This can be done without mechanical adjustment, and it can be done through a remote control.

In the example shown in FIG. 11, the E-shaped yoke 62 of the electromagnet 61 and the I-shaped iron plate 67 each comprises a laminated (layered) structure of thin plates. This structure is adopted to assure that the electromagnet 61 performs the function of a Z linear motor 4, namely, the positioning function, based on the controllability of the force of the electromagnet 61.

Where only the weight should be supported, the change in electric current through the coil is small and, therefore, the E-shaped yoke or the I-shaped member may of course be made of a solid material. However, for precise position control, a current frequency of 100 Hz or more is required and, therefore, an eddy current may be created in the yoke to cause a phase delay or a force to the current phase. When the servo gain is raised, oscillation will occur in the system due to the phase delay of the force. Where the yoke 62 and the iron plate 67 have a laminated (layered) structure made from thin plates, the eddy current can be made very small. Therefore, the phase delay of force to the electric current can be at a level of 1 KHz or higher, causing substantially no problem. In that case, the electromagnet 61 provides a position control function. In FIG. 11, the position control is performed by linear motors, and thus there are Z linear motors disposed in parallel. However, these linear motors may be omitted, and only the electromagnet may be used. In that occasion, the electromagnet 61 may be directly fixed to the X stage top plate 11, and supported thereby.

Using the electromagnet 61 for weight support may involve an inconvenience that, since a change in force with a gap is large, vibration in the supporting direction is easily transmitted. In order to prevent it, a gap sensor (not shown) may be used such that the gap change is fed back to the electric current to the electromagnet 61, to thereby intercept the vibration due to the gap change.

Also in this embodiment, in place of using an attraction force of a magnet and a magnetic material, an attraction force may be produced by using magnets.

In place of producing a floating force by use of a magnetic attraction force, a repulsion force may be produced by use of a magnet force. In that occasion, the support structure does not need a telescopic structure (FIGS. 3, 8, 10, 11), and the whole height can be made small.

Figure 12A:
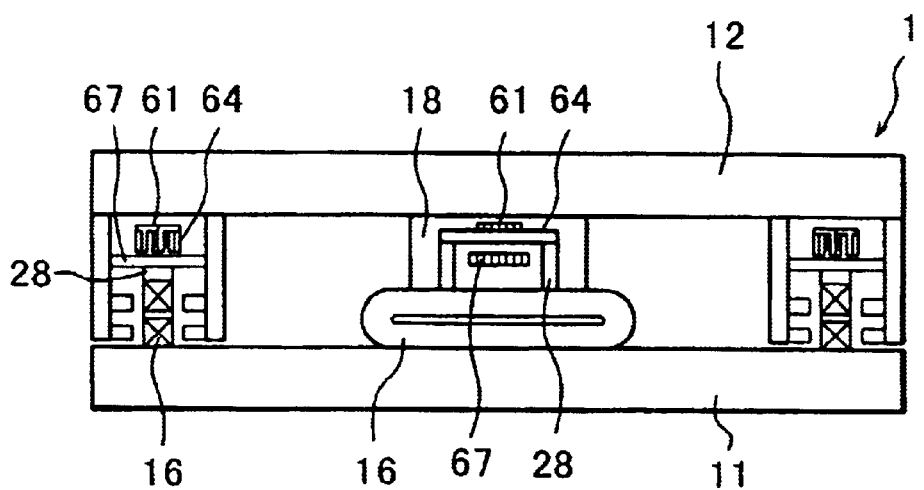
Figure 12B:
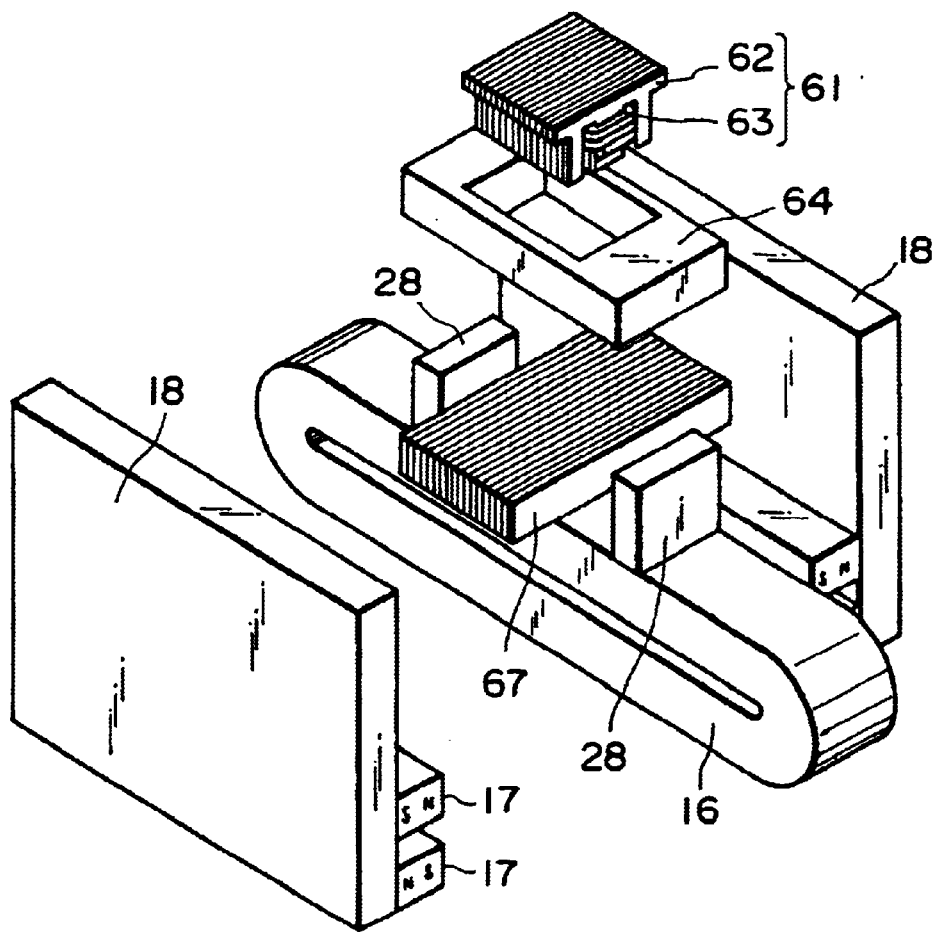

FIGS. 12A and 12B show a modified example of the fifth embodiment of the present invention, wherein FIG. 12A is a front view in a state in which a yoke in front of a Z linear motor is demounted, and FIG. 12B is an exploded perspective view. In this supporting system, an electromagnet 61 is fixed to the flat coil 16 side, and a laminated iron plate 67 is fixed to the wafer stage top plate 12 side.

At the opposed portion between the electromagnet 61 and the iron plate 67, the size of the iron plate along a plane perpendicular to the attracting direction is made larger than that of the electromagnet 61. As a result, when an electric current is flown to the coil 63 at the central portion of the yoke 62 to produce an attraction force between the electromagnet 61 and the iron plate 67, a mutual shift in a direction along the plane perpendicular to the attracting direction does not cause a substantial change in the distribution of magnetic lines of force. Thus, any vibration along the plane perpendicular to the attracting direction can be intercepted.

The iron plate 67 disposed below is fixed to the wafer stage top plate 12 disposed above, through the yoke 11. The electromagnet 61 disposed above is fixed to the flat coil 16 through an electromagnet holder 64 and an supporting member 28. The attraction element disposed below is fixed to the wafer stage top plate 12 side disposed above, while the attraction element disposed above is fixed to the X stage top plate 11 disposed blow. Namely, the support is made in a telescopic structure. With this arrangement, the floating force is applied from the X stage top plate 11 disposed below to the wafer stage top plate 12 disposed above, such that substantially the same advantageous results as those of the fifth embodiment (FIG. 11) are attainable.

[Sixth Embodiment]

Figure 13A:
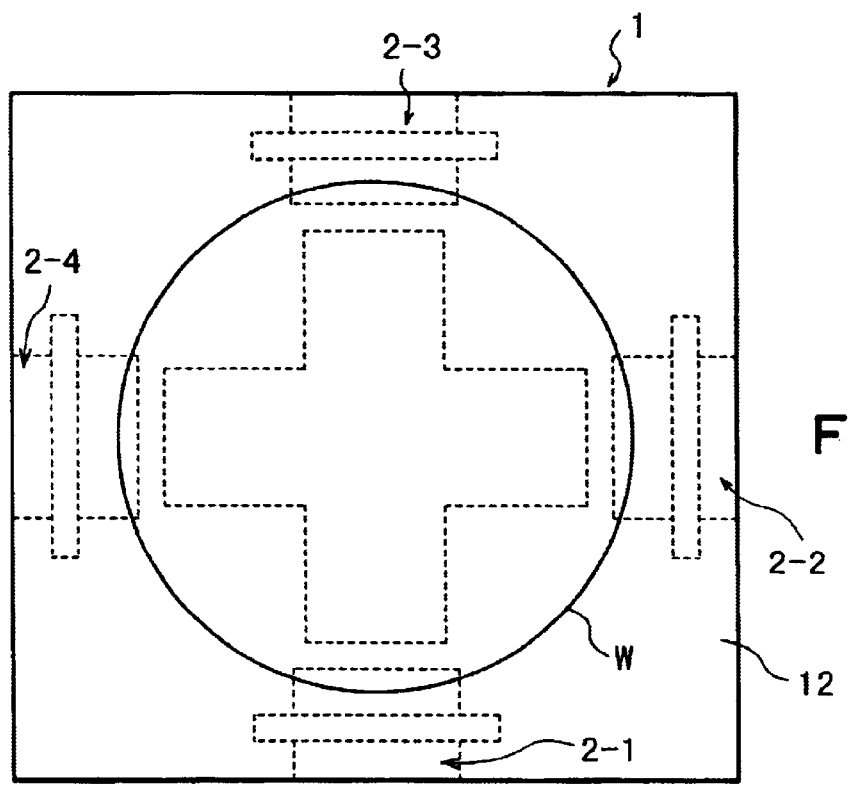
Figure 13B:
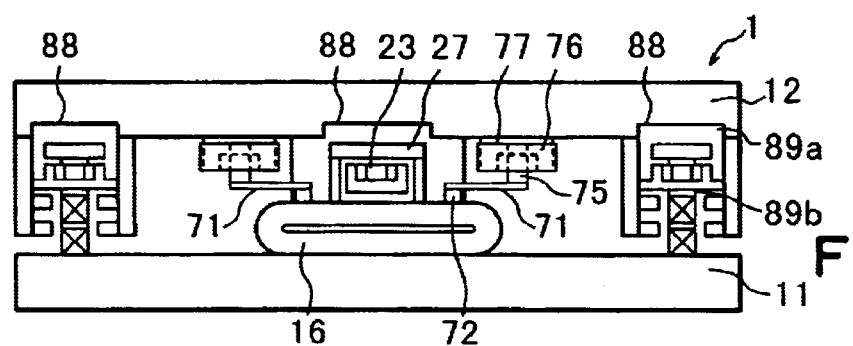
Figure 13C:
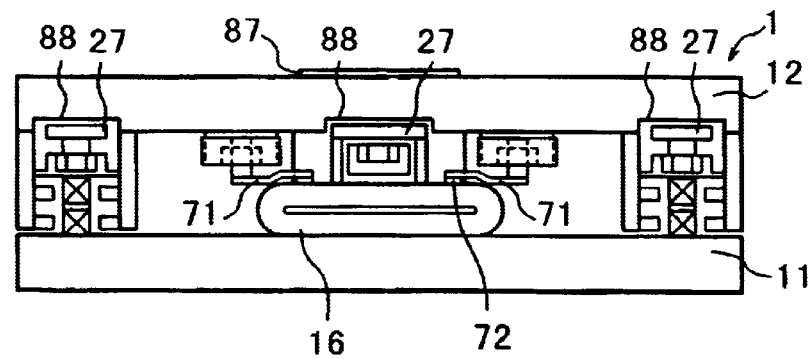

FIGS. 13A, 13B and 13C show a fine-motion stage of a supporting system according to a sixth embodiment of the present invention, wherein FIG. 13A is a top view, and FIGS. 13B and 13C are front views in a state in which a yoke in front of a Z linear motor is demounted.

In this embodiment, in order to place a wafer W on the fine-motion stage 1, a transfer mechanism for transferring the wafer W from a hand to the fine-motion stage 1 is necessary. A portion of this mechanism is provided by the fine-motion stage 1. In the supporting system of this embodiment, in addition to the structure of the first embodiment, that is, the weight supporting system based on the attraction magnet 23 of telescopic structure wherein a difference in size is set along a plane perpendicular to the attracting direction, there is a leaf spring 71 with an evasion 74 provided in parallel. Further, in consideration of the transfer operation, there is a recess 88 which is formed at the top of the weight supporting system based on the attraction magnet 23 of telescopic structure.

Figure 14:
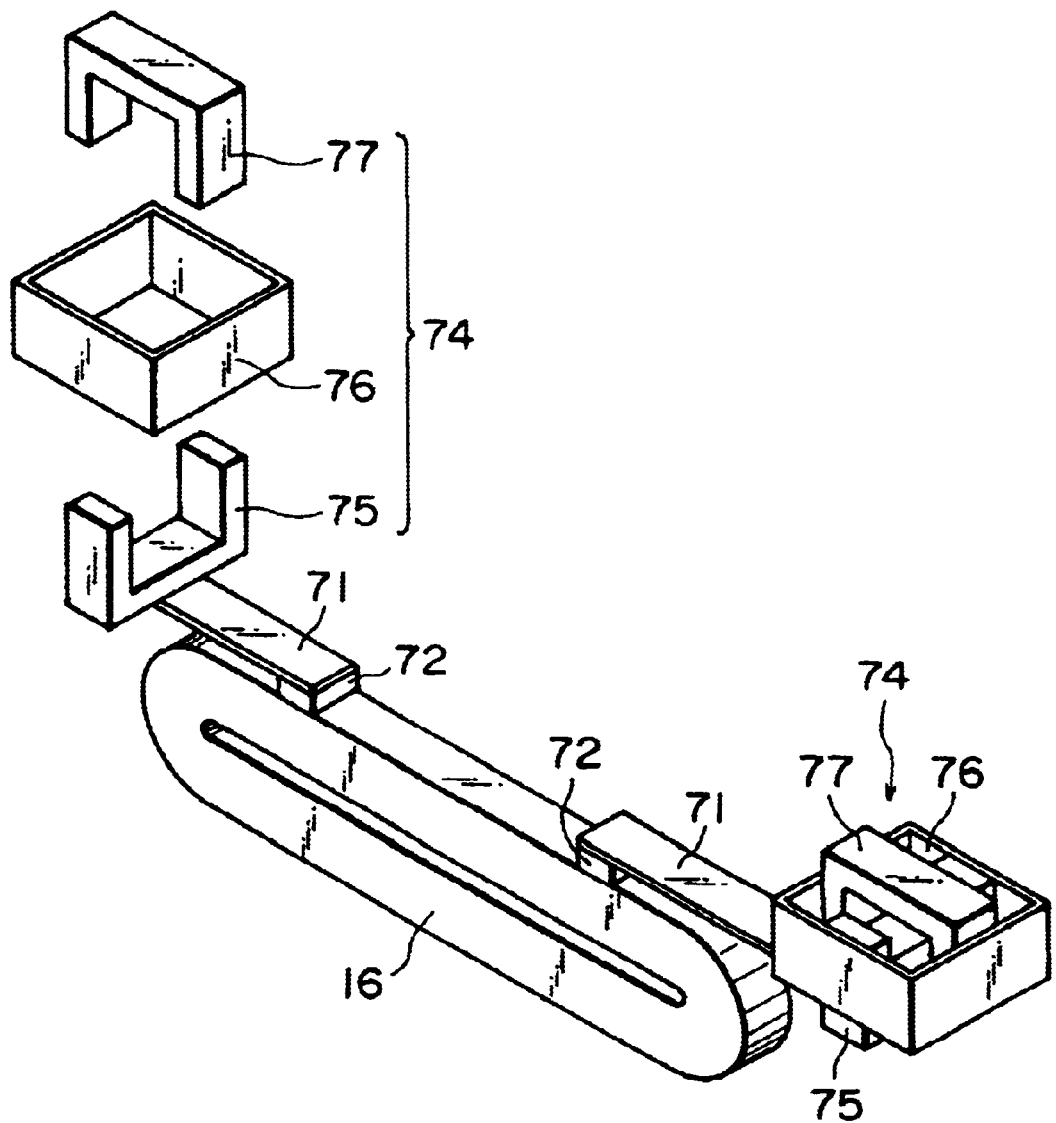
FIG. 14 is an enlarged view of a portion of FIGS. 13A–13C.

The leaf spring 71 in this embodiment produces a force for supporting the weight, and the plate surfaces thereof faces up and down. Since it is rigid in a plane perpendicular to the flexure direction, it can not intercept vibration along the plane perpendicular to the supporting direction. In consideration of it, as shown in FIG. 14, the evasions 74 are provided in series to the leaf spring 71, so as to prevent that, when the X stage top plate 11 and the wafer stage top plate 12 shift along the plane perpendicular to the supporting direction, a resilience force is applied in the shift direction.

An end of the leaf spring 71 is fixed to the upper side of the flat coil 16, fixed to the X stage top plate 11, through a leaf spring supporting member 72. A lower channel-shaped member 75 is fixed to the other end of the leaf spring 71. The outside face of the member 75 and two opposed faces of a window-shaped leaf spring 76 are fixed to each other. The upper side of a channel-shaped member 77 is fixed to the wafer stage top plate 12. The leaf spring 76 is rigid with respect to the vertical direction and it is flexible in the horizontal direction. Therefore, when a shift occurs along a plane perpendicular to the supporting directions it functions well to minimize the resilience (resisting) force in the shift direction. This Embodiment uses two sets of such components, each set comprising an upper channel-shaped member 77, a window-shaped leaf spring 76, a lower channel-shaped member 75, a leaf spring 71 and a leaf spring supporting maker 72. These two sets are disposed at the upper side of the flat coils 16, at geometrically symmetric positions. Where only one set of leaf spring support is used, there may occur a moment in addition to the supporting force. By using two sets geometrically symmetrically, production of moment is prevented. Any number of sets may be used, provided that geometrical symmetry is assured. The structure of the six-axis fine-motion mechanism itself is the same as the first embodiment. Any vibration disturbance along a plane perpendicular to the supporting direction can be reduced, and the positional precision can be improved.

The attracting magnet 23 of telescopic structure having a size difference along a plane perpendicular to the attracting direction and the leaf spring 71 with an evasion 74 provide the weight supporting function and the vibration intercepting function, as has been described with reference to the embodiments. Also in this embodiment, they produce advantageous results similar to those of the first to fifth embodiments.

Here, duplicate use of the attraction magnet 23 and the leaf spring 71 with an evasion 74, having similar functions, will now be explained in detail. In the attracting magnet 23 of telescopic structure having a difference in size along a plane perpendicular to the attracting direction, in response to a shift of the iron plate in the attracting direction, a force opposite to the resilience force is produced. Namely, it has a negative rigidity. On the other hand, with the leaf spring 71, a resilience force operates against the displacement of the leaf spring 71. Namely, it has a positive rigidity. Combining an element having a negative rigidity and an element having a positive rigidity provides an important meaning, in the fine-motion stage which provides a portion of the function as the transfer mechanism, as follows.

In this embodiment, the portion of the transfer function which the fine-motion stage 1 bears is the retracting function. FIG. 13B shows a state in which the wafer stage top plate 12 is not retracted. FIG. 13C shows a state in which the top plate 12 is retracted downwardly.

It is now assumed that the fine-motion stage 1 having no wafer W carried thereon is in the state of FIG. 13B. Subsequently, a wafer hand (not shown) takes a wafer W to the above of the fine-motion stage 1. Then, the wafer stage top plate 12 of the fine-motion stage 1 is retracted downwardly (FIG. 13C). At this time, there remains a portion not retracted, and it is the protrusion 87 shown in FIG. 13C. Since there is a recess 88 formed in the top plate 12, the iron plate 27 and the top plate 12 do not contact with each other. In an case where the weight is supported by a telescopic structure and where the subject to be supported is retracted, it is necessary to provide similar retraction spaces 89a and 89b at upper and lower sides of the telescopic structure. Subsequently, the wafer hand returns while leaving the wafer W there. Then, the wafer stage top plate 12 moves again upwardly to its original position to hold the wafer W. After this, the stage moves to a predetermined position, and an exposure process is performed.

In this procedure, the operation for retracting and moving up again the wafer stage top plate 12 is accomplished by applying an electric current to the flat coil 16 to produce a force in the Z direction. The retraction stroke is a few millimeters. If the weight should be supported only by the attracting magnet 23 or only by the leaf spring 71, the linear motor 4 should produce a force corresponding to the change in supporting force of the supporting mechanisms in response to the shift in Z direction, and heat generation resulting from it can not be disregarded. Due to the heat generation, thermal deformation of the stage top plate 12 may occur.

Where the attraction magnet 23 with negative rigidity and the leaf spring 71 with positive rigidity are used in combination, when the wafer stage top plate 12 retracts by a few millimeters, from the state of FIG. 13B to the state of FIG. 13C, the gap is expanded and the attracting force of the magnet 23, that is, the floating force, is reduced On the other hand, at the leaf sprint 71, the flexure increases to enlarge the spring force and thus the floating force. Thus, through appropriate setting, changes in force of them can be substantially cancelled.

As a result of this, even when the top plate 12 is retracted by a few millimeters for wafer placement, heat generation at the linear motor 4 can be suppressed and, thus, thermal deformation of the top plate 12 can be prevented. Further, in respect to the vibration transmission in the supporting direction, cancellation of the spring constants is effective to improve the vibration blocking performance in the supporting direction.

Figure 15:
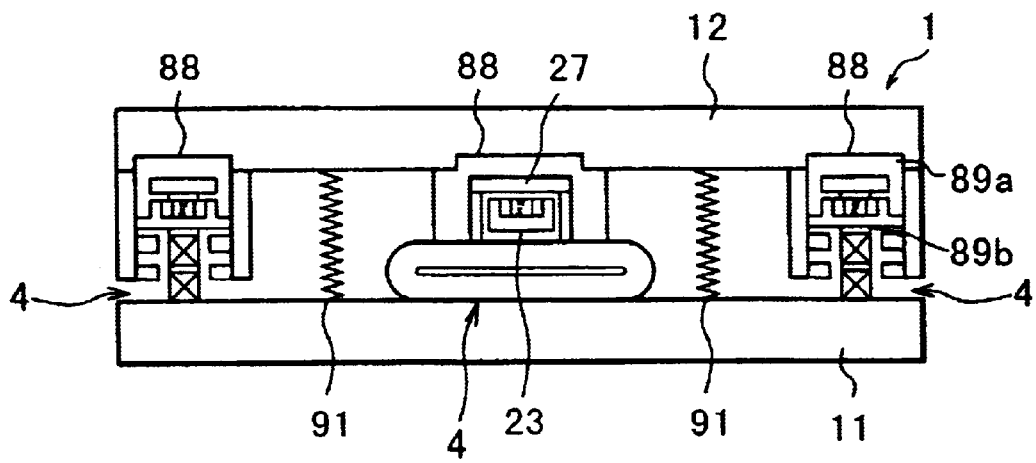
FIG. 15 is a front view, showing a first modified example of the sixth embodiment of the present invention.
Figure 16:
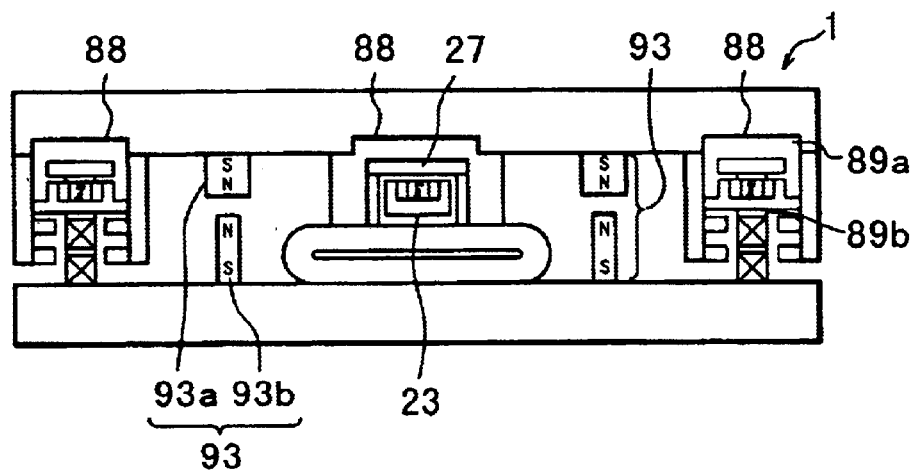
FIG. 16 is a front view, showing a second modified example or the sixth embodiment of the present invention.

FIGS. 15 and 16 show modified examples of the sixth embodiment of the present invention. FIG. 15 shows an example wherein, in place of the leaf spring 71 with evasion 74, the element having a positive rigidity is provided by a plurality of coil springs 91 which are disposed between the top face of the X stage top plate 11 and the bottom face of the wafer stage top plate 12. The operation, function, effect, and the necessity of retraction spaces 89a and 89b are all correspond to those of the sixth embodiment (FIG. 13).

FIG. 16 shows an example wherein the element having a positive rigidity is provided by a repulsion magnet 93 including a large magnet 93a and a small magnet 93b, whose opposed surfaces have different areas. The magnet 93a is secured to the bottom face of the wafer stage top plate 12 while the magnet 93b is secured to the top face of the X stage top plate 11, wherein their faces to be opposed to each other have different areas. With this arrangement, any vibration along the plane perpendicular to the supporting direction can be intercepted. The remaining operation, function, effect, and the necessity of retraction spaces 89a and 89b all correspond to those of the sixth embodiment.

Figure 17:
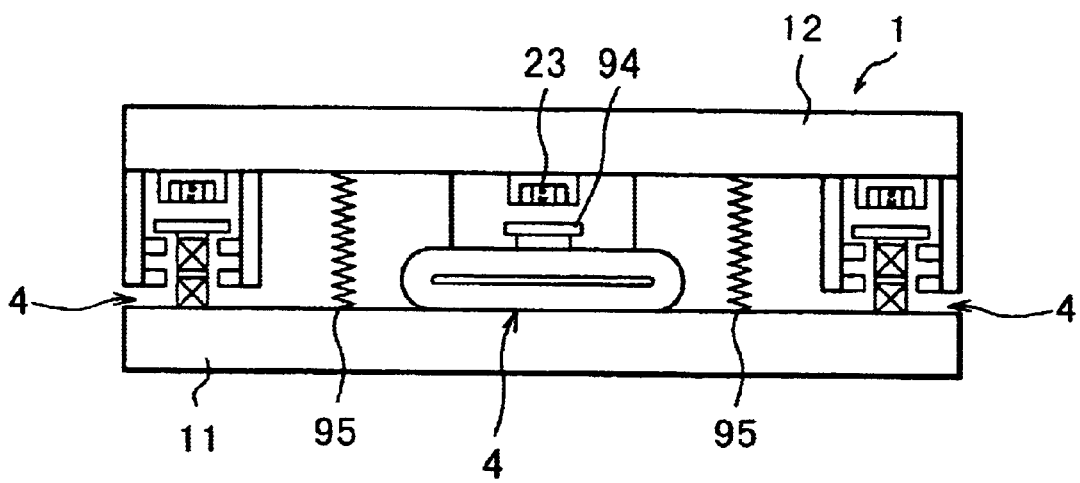
FIG. 17 is a front view, showing a third modified example of the sixth embodiment of the present invention.

FIG. 17 is a front view of a further modified example of the sixth embodiment. The structural components used in this example are similar to those of the example of FIG. 15. As compared with the attracting magnet 23 of telescopic structure used in the FIG. 15 example, in this example the magnet 23 does not have a telescopic structure but, rather, the magnet 23 is simply fixed to the wafer stage top plate 12. Also, a downward moving iron plate 94 is fixed to the flat coil 16 which is fixed to the top plate 11. As a result of this, while the retraction space 89 is defined above the magnet 23 in the FIG. 15 example, in this example such space is not used. Further, while in the FIG. 15 example the magnet 23 produces a force for floating the stage top plate 12, in this example the magnet 23 produces a weak force for pulling the top plate 12 downwardly. In place, the coil springs 95 function to support the weight of the wafer stage top plate 12. In this example, when the top plate 12 retracts from the FIG. 17 state for the wafer placement, the flexure of the coil spring 95 increases. On the other hand, since the spacing between the magnet 23 and the iron plate 94 is reduced, the force applied downwardly to the top plate 12 increases. Thus, with appropriate setting, the increase of force applied upwardly to the top plate 12 and the increase of force applied downwardly to the top plate 12 can be cancelled.

As a result, even if the top plate 12 is retracted by a few millimeters for wafer placement, heat generation at the linear motor can be suppressed and, thus, thermal deformation of the wafer stage top plate 12 can be prevented, like the sixth embodiment shown in FIG. 13.

Further, in respect to the vibration transmission in the supporting direction, cancellation of the spring constants is effective to improve the vibration blocking performance in the supporting direction, like the sixth embodiment of FIG. 13.

Since the magnet 23 does not have a telescopic structure, only the retraction space is necessary at the gap side. The height as a whole can be lowered.

In this example, in the state of FIG. 17, that is, in the state for exposure process, the spring constant of the coil spring 95 can easily be set to be larger than the negative spring constant of the magnet 23. Once the setting is made so, in the FIG. 17 state (prepared for exposure process), with a shift in the supporting direction from the balanced position, a resilience force operates in the supporting direction. Namely, a stable system wherein stability is produced automatically at the balanced position, is assured. Thus, even if the power source of the linear motor 4 is disconnected and the control becomes unattainable, it can be held stationary at the balanced position. This is advantageous in respect to the safety.

Figure 18:
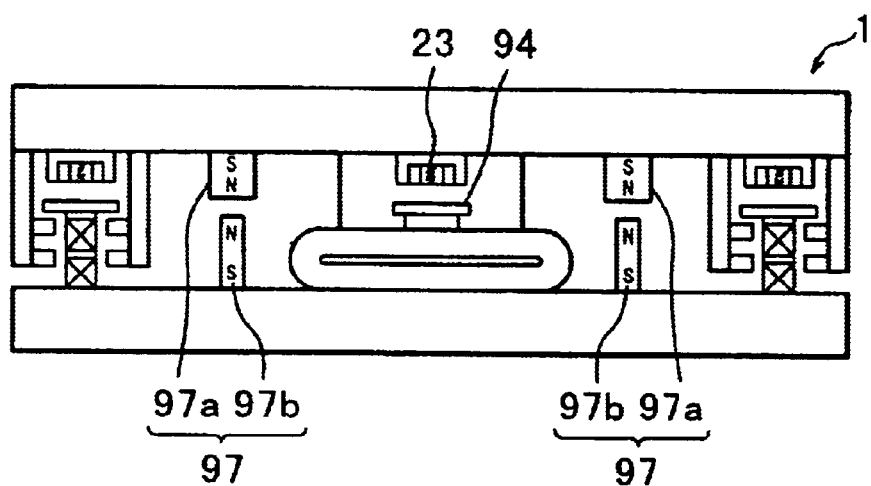
FIG. 18 is a front view, showing a fourth modified example of the sixth embodiment of the present invention.

FIG. 18 is a front view of a further modified example to the FIG. 17 example. In this example, in place of the coil spring 95, the element having a positive rigidity is provided by repulsion magnets 97 (97a, 97b) having different areas at their opposed faces. Like the FIG. 17 example, the attraction magnet 23 is arranged to produce a force for pulling down the wafer stage top plate 12. The function and effect of this embodiment are the same as those of the FIG. 17 example.

[Seventh Embodiment]

Figure 19A:
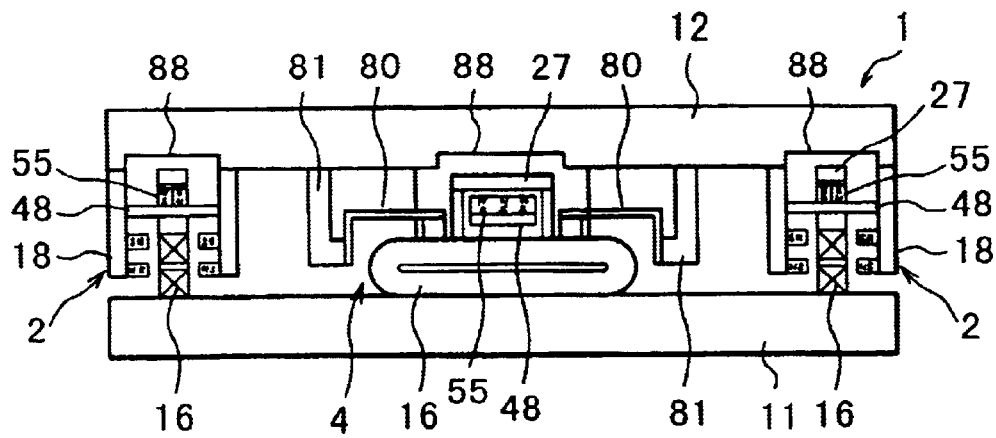
Figure 19B:
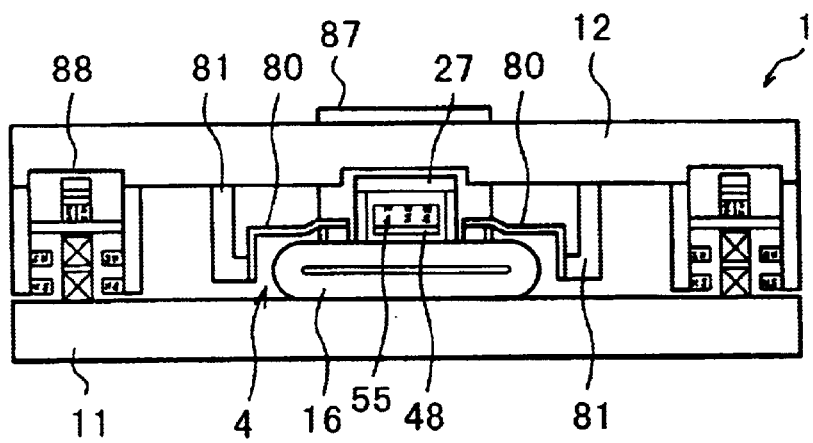
Figure 19C:
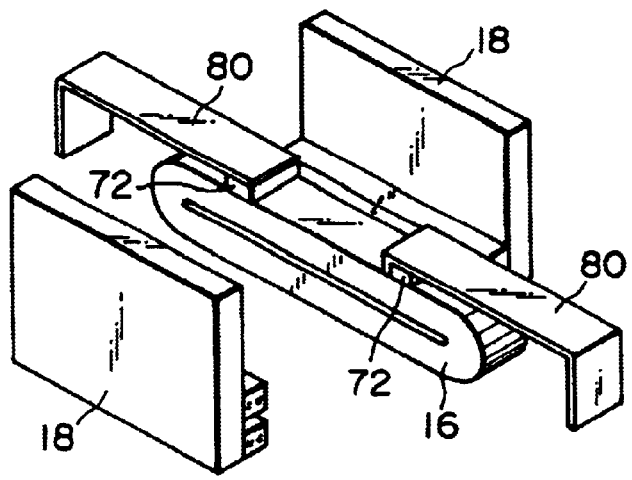

FIGS. 19A, 19B and 19C Show a fine-motion stage of a supporting system according to a seventh embodiment of the present invention, wherein FIGS. 19A and 19B are front views, respectively, and FIG. 19C is an enlarged and exploded perspective view.

In order to place a wafer W on the fine-motion stage 1, a transfer mechanism for transferring the wafer W from a hand to the fine-motion stage 1 is necessary. A portion of this mechanism is provided in this embodiment by the fine-motion stage 1. In the supporting system of this embodiment, in addition to the structure of FIGS. 9 or 10, that is, the weight supporting system based on the attraction magnet 55 of telescopic structure wherein a difference in size is set along a plane perpendicular to the attracting direction, there is an L-shaped leaf spring 80 provided in parallel. Further, in consideration of the transfer operation, there is a recess 88 which is formed at the top of the weight supporting system based on the attraction magnet 55 of telescopic structure. In this case, while the weight is supported by the leaf spring 80, if the simple leaf spring 71 having an I-shaped section shown in FIG. 14 is used, it is rigid in the plane perpendicular to the flexure direction. It is not possible to block the vibration along the plane perpendicular to the supporting direction, only by use of this spring.

In consideration of it, the L-shaped leaf spring 80 is used so that, when the top plate 12 shifts in a direction along the length of the flat coil 16, no resilience force is applied in the shift direction. A pair of L-shaped leaf springs 80 are used. A base end is fixedly connected to the coil 16 through a supporting member 72. The outside face of each free end is fixedly connected to the lower end of the corresponding yoke 81, projected from the top plate 12 downwardly.

The Z drive suspension units 2 is disposed so that the direction in which the resilience force of the magnet 55 similar to that of FIG. 8 and the L-shaped spring 80 does not apply is put along the circumferential direction of the universal joint 6 shown in FIG. 8.

The attraction magnet 55 of telescopic structure having a difference in size in the direction of the length of the coil 16 as well as the L-shaped leaf spring 80 have, as has been described with reference to the preceding embodiments, the weight supporting function and the vibration blocking function. Also in this embodiment, substantially the same functions and effects as those of the preceding examples are attainable.

Here, duplicate use of the attraction magnet 55 and the L-shaped leaf spring 80 having similar functions, will now be explained in detail. In the attracting magnet 55 of telescopic structure having a difference in size along a plane perpendicular to the attracting direction, in response to a shift of the magnet and the iron plate in the attracting direction, a force opposite to the resilience force is produced. Namely, it has a negative rigidity. On the other hand, with the leaf spring 80, a resilience force operates against the displacement of the leaf spring 80. Namely, it has a positive rigidity. Combining an element having a negative rigidity and an element having a positive rigidity provides an important meaning, in the fine-motion stage which provides a portion of the function as the transfer mechanism. Also, the portion of the transfer function which the fine-motion stage bears is the retracting function. Since they are substantially the same as those of the sixth embodiment shown in FIG. 13, description will be omitted.

Where the attraction magnet 55 with negative rigidity and the leaf spring 80 with positive rigidity are used in combination, when the wafer stage top plate 12 retracts by a few millimeters, from the state of FIG. 19B to the state of FIG. 19C, the gap is expanded and the attracting force of the magnet 55, that is, the floating force, is reduced. On the other hand, at the leaf spring 80, the flexure increases to enlarge the spring force and thus the floating force. Thus, through appropriate setting, changes in force of them can be substantially cancelled.

As a result of this, even when the top plate 12 is retracted by a few millimeters for wafer placement, heat generation at the linear motor 4 can be suppressed and, thus, thermal deformation of the top plate 12 can be prevented. Further, in respect to the vibration transmission in the supporting direction, cancellation of the spring constants is effective to improve the vibration blocking performance in the supporting direction.

Figure 20:
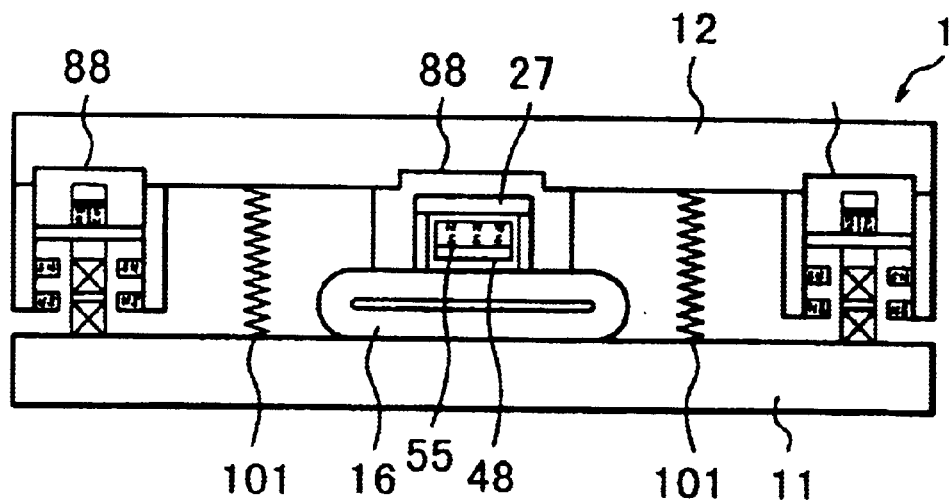
FIG. 20 is a front view, showing a first modified example of the seventh embodiment of the present invention.

FIG. 20 shows a first modified example of the seventh embodiment of the present invention. In place of the leaf spring 80, the element having a positive rigidity is provided by a coil spring 101. The operation, function, effect, and the necessity of retraction spaces 89a and 89b are all correspond to those of the seventh embodiment (FIG. 19).

Figure 21:
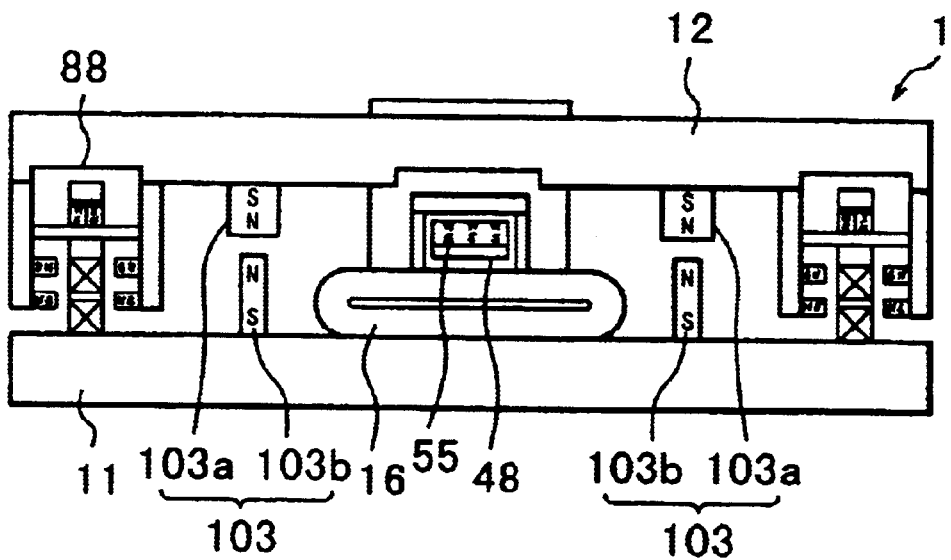

FIG. 21 shows a second modified example wherein the element having a positive rigidity is provided by a repulsion magnet 103 including magnets 93a and 93b, whose opposed surfaces have different areas. The repulsion magnets are arranged to have a difference in area at the opposed faces. With this arrangement, any vibration along the plane perpendicular to the supporting direction can be intercepted. The size difference in the opposed faces may he set in every direction along the plane. However, if it is set specifically with respect to the direction along the circumference of the universal joint 6, the vibration blocking performance can be improved more. Alternatively, the difference in area can be made smaller without degrading the vibration blocking function. The remaining operation, function, effect, and the necessity of retraction spaces 89a and 89b all correspond to those of the sixth embodiment of FIG. 19.

Figure 22:
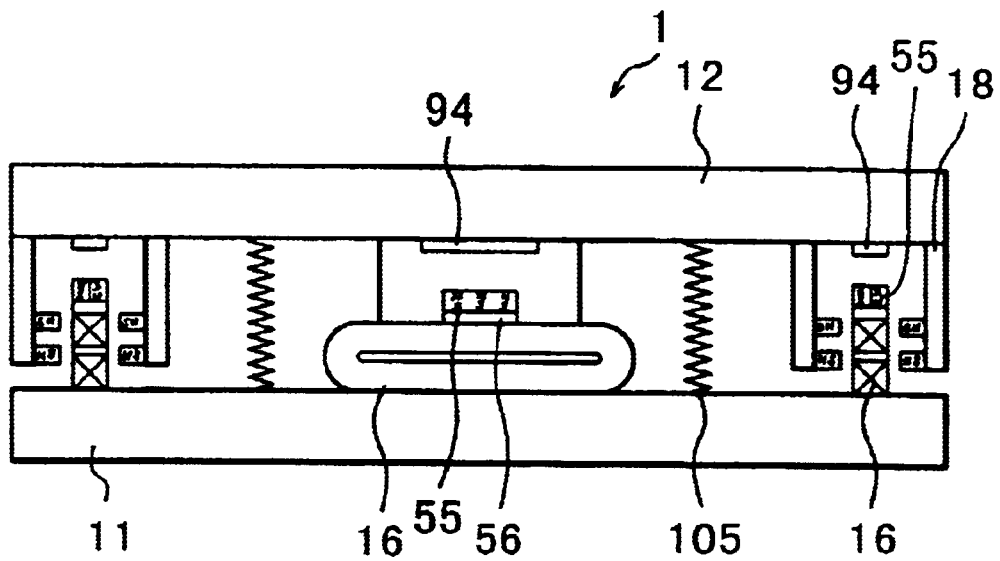
FIG. 22 is a front view, showing a third modified example of the seventh embodiment of the present invention.

FIG. 22 is a front view of a third modified example of the sixth embodiment. The structural components used in this example are similar to those of the example of FIG. 20. As compared with the attracting magnet 55 of telescopic structure used in the FIG. 20 example, in this example the magnet 55 does not have a telescopic structure. Also, a downward moving iron plate 94 is simply fixed to the wafer stage top plate 12. Also, the magnet 55 is fixed, through a yoke 56, to the flat coil 16 of the linear motor 4 which is fixed to the top plate 11. As a result of this, while the retraction space 89 is defined above the magnet 55 in the first and second modified examples shown in FIGS. 20 and 21, in this example such space is not used. Further, while in the FIG. 20 example the magnet 55 produces a force for floating the stage top plate 12, in this example the magnet 55 produces a weak force for pulling the top plate 12 downwardly. In place, the coil springs 105 function to support the weight of the wafer stage top plate 12.

When the top plate 12 retracts from the FIG. 22 state for the wafer placement, the flexure of the coil spring 105 increases. On the other hand, since the spacing between the magnet 55 and the iron plate 94 is reduced, the force applied downwardly to the top plate 12 increases. Thus, with appropriate setting, the increase of force applied upwardly to the top plate 12 and the increase of force applied downwardly to the top plate 12 can be cancelled.

As a result, even if the top plate 12 is retracted by a few millimeters for wafer placement, heat generation at the linear motor can be suppressed and, thus, thermal deformation of the wafer stage top plate 12 can be prevented like the seventh embodiment shown in FIG. 19.

Further, in respect to the vibration transmission in the supporting direction, cancellation of the spring constants is effective to improve the vibration blocking performance in the supporting direction, like the seventh embodiment of FIG. 19.

A large difference of this example over the seventh embodiment of FIG. 19 is that, since the magnet 55 does not have a telescopic structure, only the retraction space is necessary at the gap side. The height as a whole can be lowered.

In this example, in the state of FIG. 22, that is, in the state for exposure process, the spring constant of the coil spring 105 can easily be set to be larger than the negative spring constant of the magnet 55. Once the setting is made so, in the FIG. 22 state (prepared for exposure process), with a shift in the supporting direction from the balanced position, a resilience force operates in the supporting direction. Namely, a stable system wherein stability is produced automatically at the balanced position, is assured. Thus, even if the power source of the linear motor 4 is disconnected and the control becomes unattainable, it can be held stationary at the balanced position. This is advantageous in respect to the safety.

Figure 23:
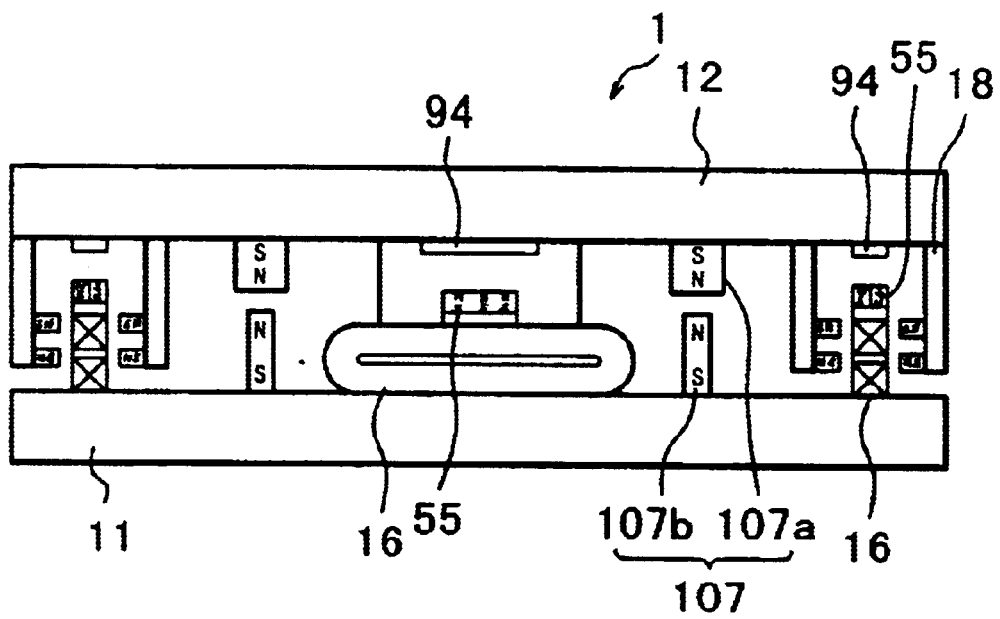
FIG. 23 is a front view, showing a fourth modified example of the seventh embodiment of the present invention.

FIG. 23 is a front view of a fourth modified example of the seventh embodiment, further modification being made to the example of FIG. 22. In this example, in place of the coil spring 105, the element having a positive rigidity is provided by repulsion magnets 107 (107a, 107b) having different areas at their opposed faces Like the FIG. 22 example, the attraction magnet 55 and the iron plate 94 are arranged to produce a force for pulling down the wafer stage top plate 12. The function and effect of this embodiment are the same as those of the FIG. 22 example.

Here, comparison will be made in regard to the amount of heat generation by the linear motor 4 in the transfer procedure and to the stability at the exposure position, between a type in which the attraction magnet 23 has a telescopic structure and produces a floating force to the top plate 12 such as shown in FIGS. 1, 15 and 16, and a type in which the magnet 23 or 55 does not have a telescopic structure but it applies a downwardly pulling force to the top plate 12. Namely, the influence of a telescopic structure and non-telescopic structure to the heat generation at the linear motor 4 during the transfer process and the condition setting for stabilized exposure, will be considered.

Figure 24A:
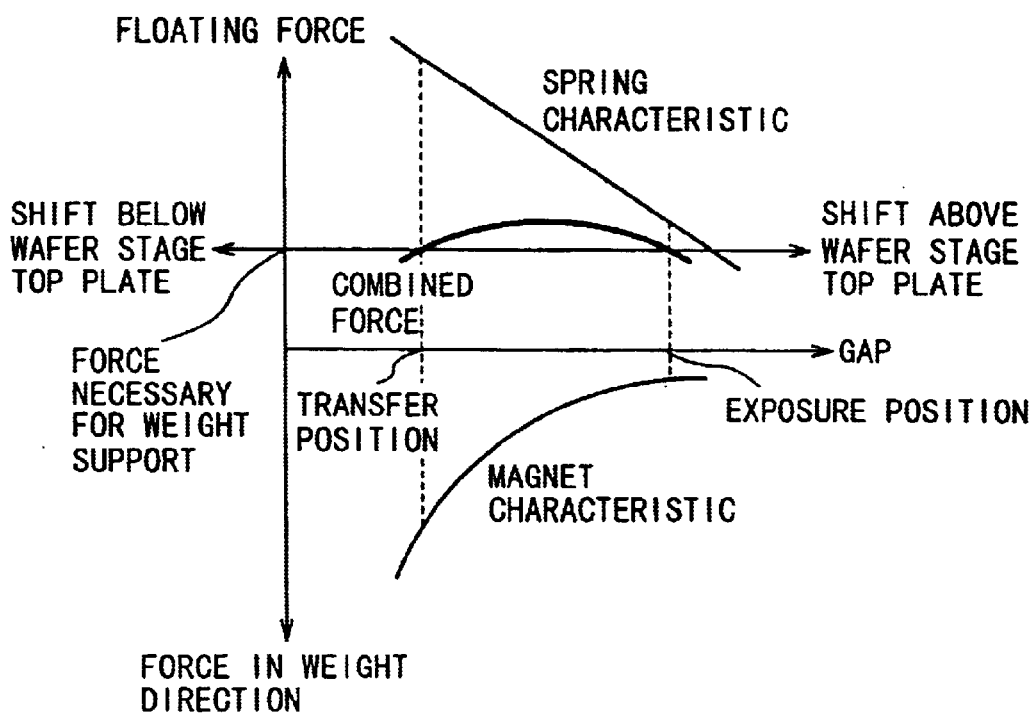
FIGS. 24A, 24B, 25, 26 and 27 are graphs each showing a example of balancing condition for a magnet and a spring in a supporting system according to the present invention.

FIG. 24A shows the characteristics, to a gap, of the spring force, magnet force, and a combined force of them, as the magnet 23 not having a telescopic structure but applying a downward pulling force to the top plate 12, is set to be stabilized at the exposure position. The axis of abscissa in FIG. 14A is the magnet gap, and the direction in which the gap increases corresponds to the direction in which the top plate 12 shift upwardly. The axis of ordinate denotes the floating force. The negative direction along the axis of ordinate denotes the force for moving the top plate 12 downwardly. First, a force for floating the top plate 12 is continuously produced at the spring 95, and it is in the upper half region in the coordinate system of FIG. 24A. The spring force changes linearly in response to the change in gap or a shift of the top plate 12, and the force in the floating direction decreases in response to the increase of the gap or to the upward shift of the top plate 12. Thus, in the region at the upper half of the coordinate system of FIG. 24A, the spring force is illustrated by a straight line tilted rightwardly downwardly.

The magnet 23 continuously produces a force for moving the top plate 12 downwardly, and it is in the region at the lower half of the coordinate system of FIG. 24A. Also, the absolute value of the attracting force changes to the gap approximately in accordance with "1/(gap)$^2$". Thus, the attracting force is in the region at the lower half of the coordinate system of FIG. 24A, and it is illustrated by a straight line tilted rightwardly upwardly.

For wafer transfer, the wafer stage top plate must be retracted. Thus, for the magnet gap, the following relation should be satisfied:

"gap at exposure position"="transfer stroke"+"gap at transfer position".

Thus, in the coordinate system of FIG. 24A, the exposure position gap is at the right-hand side of the transfer position gap.

Also, in order to support the weight of the top plate 12 at the exposure position, the relation:

"weight of top plate 12"="spring force"+"magnet force"

should be satisfied. In order to accomplish this relation, the spring constant of the spring 95 as well as the initial flexure at the exposure position should satisfy the following relation:

"spring constant"×"initial flexure"="weight"−"magnet force at exposure position"(sign of the magnet force is negative).

The spring constant and the spring initial flexure at the exposure position are set so as to be approximately equal to the weight.

For stabilization at the exposure position, as described with reference to the example of FIG. 17, the absolute value of the changing rate, to the gap, of the coil spring 95 at the exposure position should be set to be larger than the absolute value of the changing rate, to the gap, of the magnet 23. In the case of spring, the changing rate to the gap is constant regardless of the gap, and it corresponds to the tilt of the straight line that represents the spring characteristic in FIG. 24.

On the other hand, the changing rate, to the gap, of the magnet force at the exposure position corresponds to the tilt of a tangent of the magnet force characteristic curve at the gap corresponding to the exposure position.

Where the setting is made to satisfy the relation:

"absolute value of tilt of straight line representing the spring characteristic">"absolute value of tilt of a tangent of magnet force characteristic curve at gap corresponding to exposure position".

Then, the changing rate of the combined force at the exposure position, to the gap, takes a negative value in the coordinate system of FIG. 24. As the gap increases or the top plate 12 shifts upwardly, the floating force decreases. As the gap decreases or the top plate 12 shifts downwardly, the floating force increases. Thus, the system is such that a resilience force applies in response to a gap change about the balance position. Even if the linear motor or the control system goes out of order where the stage is at the balanced position, it can be kept there. The characteristic of the combined force of the spring force and magnet force is illustrated by a thick line in FIG. 24A.

In this condition setting example, the following relation should be satisfied at the transfer position:

"weight of top plate 12"="spring force"+"magnet force".

When this relation, that is, the balance at the transfer position and the balance at the exposure position, is accomplished, at the transfer position the changing rate (tilt of tangent) of the combined force (spring force plus magnet force) to the gap is tilted rightwardly upwardly. Thus, at the transfer position, without the control of linear motor 4, the system becomes unstable, In this manner, the condition setting for that the weight and the combined force are balanced at the exposure position and the transfer position, and additionally that it is stabilized at the exposure station, is very advantageous in respect to the heat generation by the linear motor 4, while there may be a small risk when the linear motor goes out of order at the transfer position.

The amount P of heat generation of the linear motor 4 during the transfer process can be approximated by:

$$p = \Sigma r(i(y))^2 \Delta t$$

where r is the resistance of the linear motor 4, i(y) is the electric current as the top plate 12 is at the position y, and Δt is the time in which the plate is about that position.

In the transfer procedure, the wafer stage top plate 12 is kept at the transfer position in most period of time. On its way, it merely passes so that the time there is very short. If therefore the setting is made so that the combined force and the weight are balanced at the transfer position, i(y) becomes substantially zero where the value Δt is large (about the transfer position). On the way to the transfer, since the top plate passes quickly the location where Δt is large, such that Δt is small and the product of i and Δt can continuously be held small. In total, the amount P of heat generation can be made small.

Also, by balancing the weight and the combined force at the exposure position, after the transfer and during the exposure process to the wafer W, the amount of heat generation of the linear motor 4 can be made substantially zero.

Figure 24B:
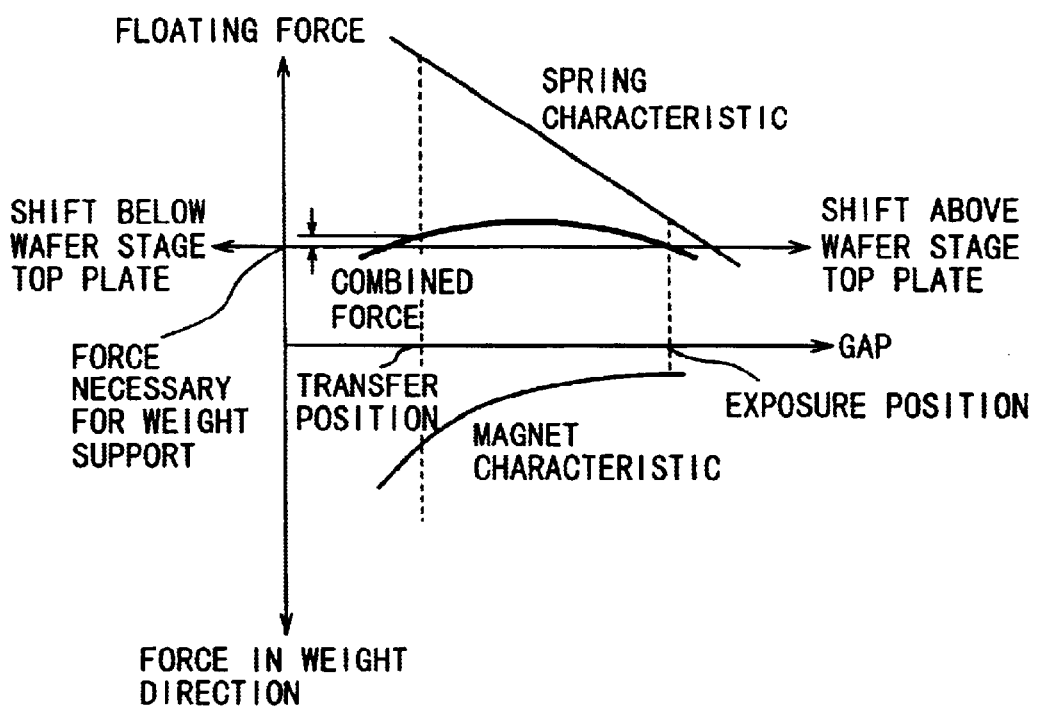

FIG. 24B shows an example wherein the combined force and the weight are balanced at the exposure position, and wherein the magnitude relation of the changing rate of the spring characteristic and the magnet characteristic at the exposure position is set so as to provide a system being stable at the exposure position; whereas, since a magnet in which the absolute value of the changing rate of the magnet characteristic is generally small is used, the balancing is not attained at the transfer position. Any imbalance must be compensated by the linear motor 4. In this example, since the electric current of the linear motor 4 becomes not zero at about the transfer position where the stay time is long, the amount of heat generation slightly increases as compared with the FIG. 24A example. However, if the amount of heat generation is small, it is not always necessary that the combined force is exactly balanced with the weight. The same applies to the exposure position. If the balance error is small, heat generation does not raise a problem.

Figure 25:
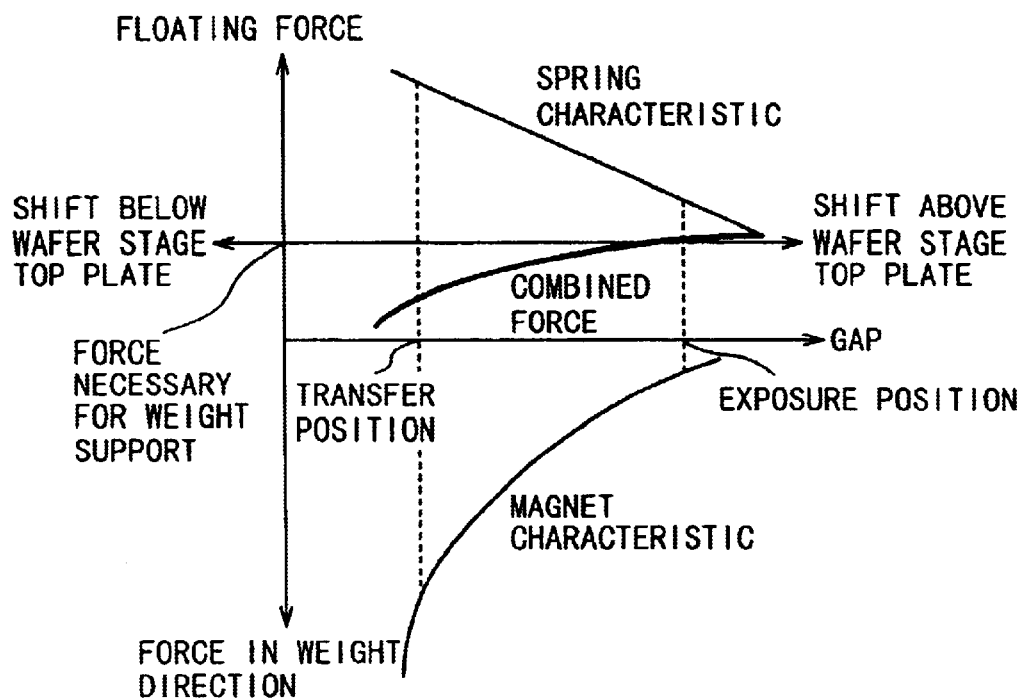

On the other hand, FIG. 25 shows an example of unpreferable setting. More specifically, FIG. 25 shows an example wherein, although the combined force and the weight are balanced at the exposure position, since the magnitude relation of the changing rate of the spring characteristic and the magnet characteristic is set so that the system is unstable at the exposure position, the weight and the combined force do not balance at a gap smaller than the exposure position. In this case, at about the transfer position where the stay time is long, the amount of imbalance between the combined force and the weight, namely, the current of the linear motor 4, becomes largest, such that the heat generation increases very much.

At the moment that the condition setting for providing an unstable system at the exposure position is done, the combined force and the weight can balance only in the state that the wafer stage top plate 12 shifts by a gap larger than the exposure position, namely, it shifts beyond the exposure position. This position is in the opposite direction to the wafer transfer and, therefore, any balance does not have a meaning. The condition setting for providing a system being unstable at the exposure position, in the type shown in FIG. 17, is undesirable since the risk upon any disorder of the linear motor at the exposure position becomes large and also the heat generation increases.

In summary, in the type in which the attracting magnet 23 such as shown in FIG. 17 has a non-telescopic structure, the condition setting with which, at the exposure position, the combined force and the weight are balanced and the system is stable there, is necessary first. Additionally, the condition should preferably be set so that the combined force and the weight are balanced at the transfer position.

If the condition is to be relieved slightly, it is desired that the combined force and the weight are balanced at the exposure position and that the characteristic of the combined force at the exposure position is stable (the tangent of the combined force at the exposure position is tilted rightwardly downwardly in the coordinate system of FIG. 24A or 24B), and also that the combined force and the weight are approximately balanced at the transfer position.

It the condition is to be relieved more, it is desirable that the combined force and the weight are balanced at about the exposure position and the transfer position, and that the characteristic of the combined force at the exposure position is stable (the tangent of the combined force at the exposure position is tilted rightwardly downwardly in the coordinate system shown in FIG. 24 or 25).

Figure 26:
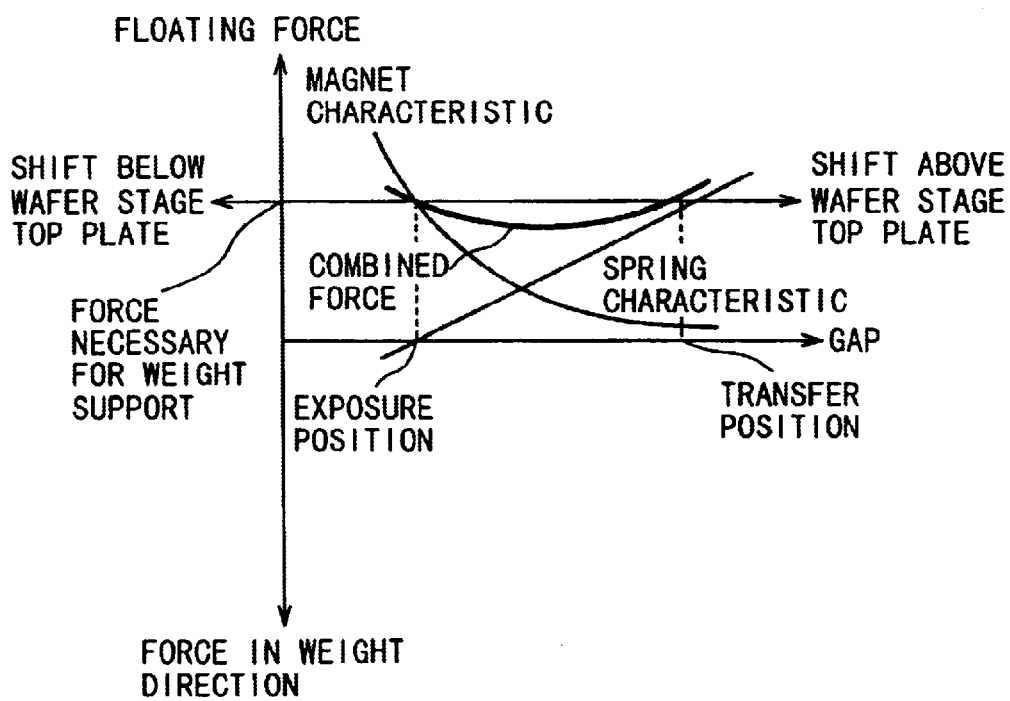

FIG. 26 shows characteristics of the spring force, the magnet force and the combined force of them to a gap, where the attraction magnet 23 shown in FIG. 15 has a telescopic structure so that it applies a floating force to the wafer stage top plate 12, and where the condition is set so that the system is unstable at the exposure position.

The axis of abscissa in FIG. 26 depicts the gap, and the direction in which the gap increases corresponds to the direction in which the top plate 12 shifts downwardly. The axis of ordinate denotes the floating force. First, a force for floating the top plate 12 is continuously produced at the spring 91, and it is in the upper half region in the coordinate system of FIG. 26. The spring force of the coil spring 91 changes linearly in response to the change in gap or a shift of the top plate 12, and the force in the floating direction decreases in response to the increase of the gap or to the upward shift of the top plate 12. Thus, in the region at the upper half of the coordinate system of FIG. 26, the spring force is illustrated by a straight line tilted rightwardly upwardly.

The magnet 23 continuously produces a force for floating the top plate 12, and it is in the region at the upper half of the coordinate system of FIG. 26. Also, the absolute value of the attracting force changes to the gap approximately in accordance with "1/(gap)$^2$". Thus, the attracting force is in the region at the upper half of the coordinate system of FIG. 26, and it is illustrated by a straight line tilted rightwardly downwardly.

For wafer transfer, the wafer stage top plate must be retracted. Thus, for the magnet gap, the following relation should be satisfied:

"gap at transfer position"="transfer stroke"+"gap at exposure position".

Thus, in the coordinate system of FIG. 26, the transfer position gap is at the right-hand side of the exposure position gap.

Also, in order to support the weight of the top plate 12 at the exposure position, the relation "weight of top plate 12"="spring force"+"magnet force"

should be satisfied. In order to accomplish this relation, the spring constant of the spring 91 as well as the initial flexure at the exposure position should satisfy the following relation:

"spring constant"×"initial flexure"="weight"−"force at exposure position"(sign of the magnet force is positive).

The spring constant and the spring initial flexure at the exposure position are set so as to be approximately equal to the weight.

Also, FIG. 26 shows a case wherein a system being unstable at the exposure position is provided. To this end, the absolute value of the changing rate, to the gap, of the coil spring 91 at the exposure position should be set to be smaller than the absolute value of the changing rate, to the gap, of the magnet 23. In the case of spring 91, the changing rate to the gap is constant regardless of the gap, and it corresponds to the tilt of the straight line that represents the spring characteristic in FIG. 26.

On the other hand, the changing rate, to the gap, of the magnet force at the exposure position corresponds to the tilt of a tangent of the magnet force characteristic curve at the gap corresponding to the exposure position.

Where the setting is made to satisfy the relation:

"absolute value of tilt of straight line representing the spring characteristic"<

"absolute value of tilt of a tangent of magnet force characteristic curve at gap corresponding to exposure position"

Then, the changing rate of the combined force at the exposure position, to the gap, takes a negative value in the coordinate system of FIG. 26. As the gap increases or the top plate 12 shifts downwardly, the floating force decreases. As the gap decreases or the top plate 12 shifts upwardly, the floating force increases. Thus, the system is such that a resilience force applies in response to a gap change about the balance position.

The characteristic of the combined force of the spring force and magnet force is illustrated by a thick line in FIG. 26.

In this condition setting example, the following relation should be satisfied at the transfer position:

"weight of top plate 12"="spring force"+"magnet force".

When this relation, that is, the balance at the transfer position and the balance at the exposure positions is accomplished, at the transfer position the changing rate (tilt of tangent) of the combined force (spring force plus magnet force) to the gap is tilted rightwardly upwardly. Thus, at the transfer position, the system becomes stable. In this manner, the condition setting for that the weight and the combined force are balanced at the exposure position and the transfer position, and additionally that it is unstable at the exposure station, is very advantageous in respect to the heat generation by the linear motor 4, while there may be a small risk when the linear motor goes out of order at the exposure position.

The amount P of heat generation of the linear motor 4 during the transfer process can be approximated by:

$$P = \Sigma r(i(y))^2 \Delta t$$

where r is the resistance of the linear motor 4, i(y) is the electric current as the top plate 12 is at the position y, and $\Delta t$ is the time in which the plate is present about that position.

In the transfer procedure, the wafer stage top plate 12 is kept at the transfer position in most period of time. On its way, it merely passes so that the time there is very short. If therefore the setting is made so that the combined force and the weight are balanced at the transfer position, i(y) becomes substantially zero where the value $\Delta t$ is large (about the transfer position). On the way to the transfer, since the top plate passes quickly the location where t is large, such that $\Delta t$ is small and the product of i and $\Delta t$ can continuously be held small. In total, the amount P of heat generation can be made small.

Also, by balancing the weight and the combined force at the exposure position, after the transfer and during the exposure process to the wafer W, the amount of heat generation of the linear motor 4 can be made substantially zero.

Figure 27:
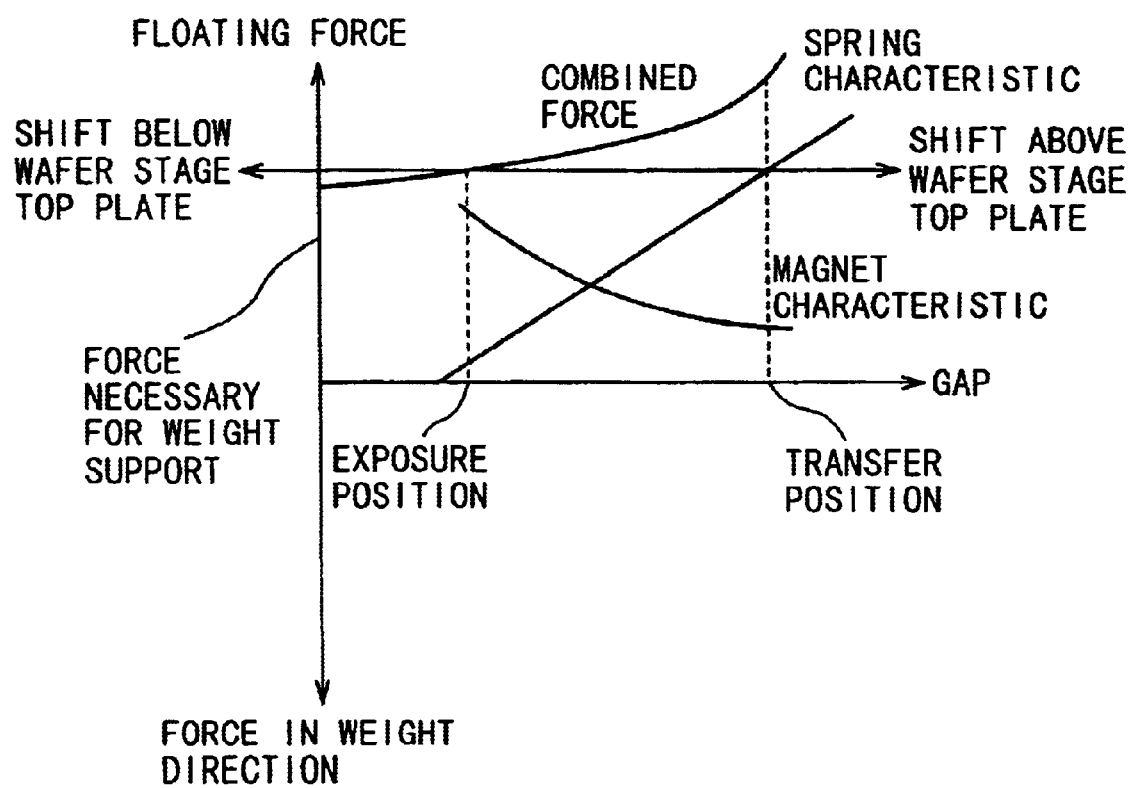
Figure 28:
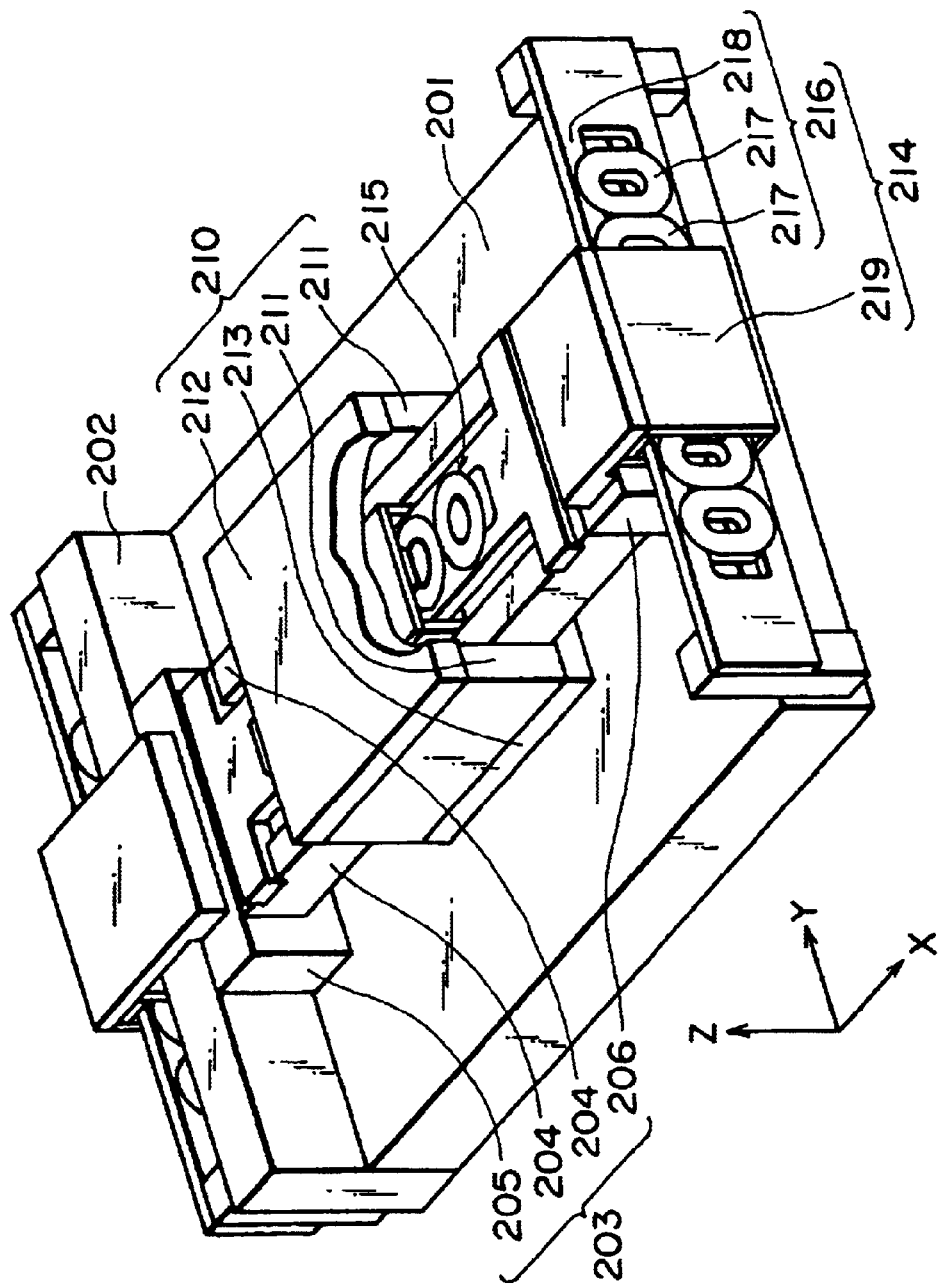
FIG. 28 is a perspective view of a conventional supporting system.
Figure 29A:
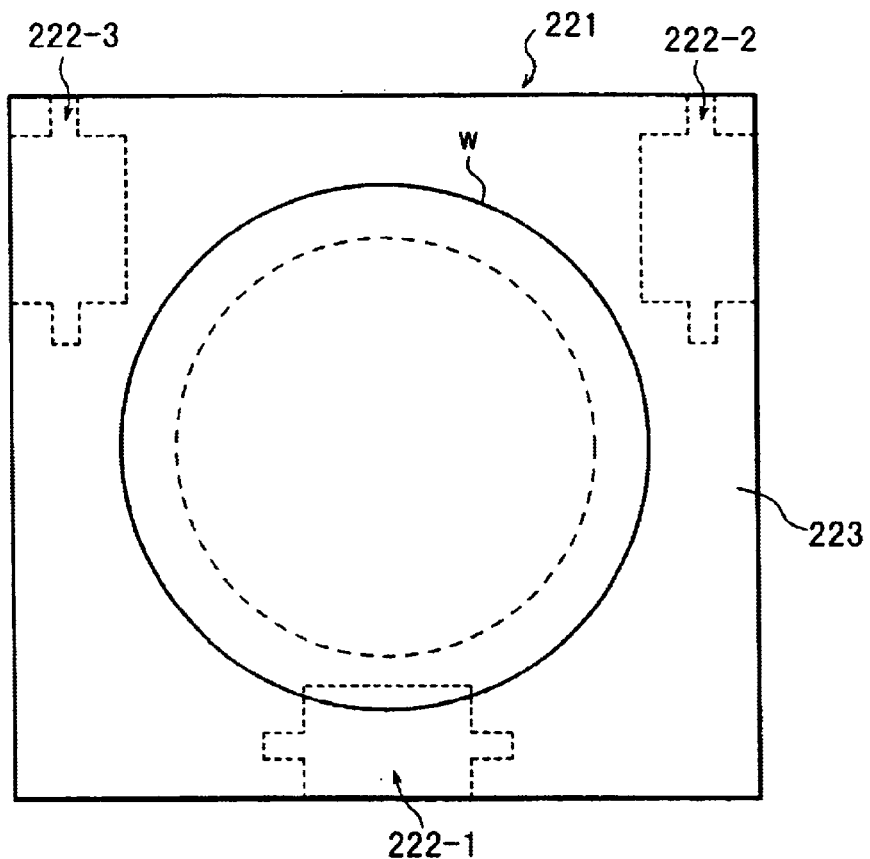
Figure 29B:
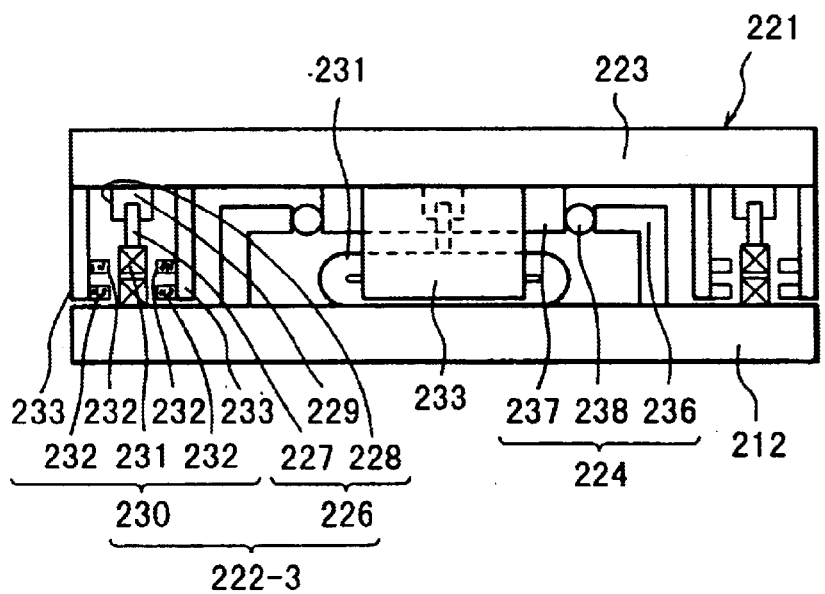
Figure 30A:
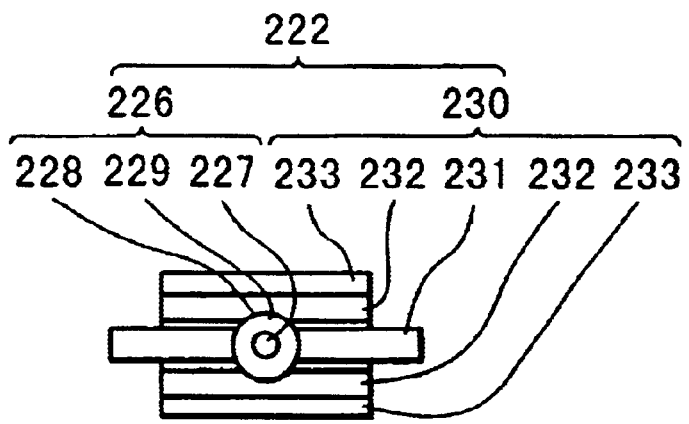
Figure 30B:
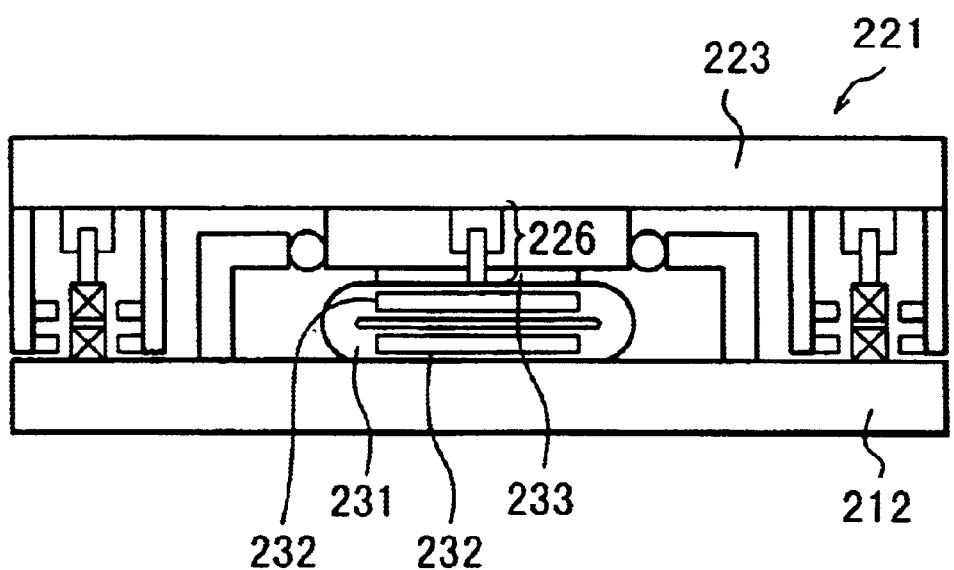

On the other hand, FIG. 27 shows an example of unpreferable setting. More specifically, FIG. 27 shows an example wherein, although the combined force and the weight are balanced at the exposure position, since the magnitude relation of the changing rate of the spring characteristic and the magnet characteristic is set so that the system is stable at the exposure position, the weight and the combined force do not balance at a gap smaller then the exposure position. In this case, at about the transfer position where the stay time is long, the amount of imbalance between the combined force and the weight, namely, the current of the linear motor 4, becomes largest, such that the heat generation increases very much.

At the moment that the condition setting for providing a stable system at the exposure position is done, the combined force and the weight can balance only in the state that the wafer stage top plate 12 shifts by a gap smaller than the exposure position, namely, it shifts upwardly beyond the exposure position. This position is in the opposite direction to the wafer transfer and, therefore, any balance does not have a meaning. Practically, the gap at the exposure position is small, so that the magnets may physically contact with each other and, therefore, the balanced state is not attainable. The condition setting for providing a system being stable at the exposure position, in the type shown in FIG. 15, is undesirable since the risk upon any disorder of the linear motor at the exposure position becomes large and also the heat generation increases.

In summary, in the type in which the attracting magnet 23 such as shown in FIG. 15 has a telescopic structure, the condition setting with which, at the exposure position, the combined force and the weight are balanced and the system is unstable there, is necessary first. Additionally, the condition should preferably be set so that the combined force and the weight are balanced at the transfer position.

If the condition is to be relieved slightly, it is desired that the combined force and the weight are balanced at the exposure position and that the characteristic of the combined force at the exposure position is unstable (the tangent of the combined force at the exposure position is tilted rightwardly downwardly in the coordinate system of FIG. 26 or 27), and also that the combined force and the weight are approximately balanced at the transfer position.

If the condition is to be relieved more, it is desirable that the combined force and the weight are balanced at about the exposure position and the transfer position, and that the characteristic of the combined force at the exposure position is unstable (the tangent of the combined force at the exposure position is tilted rightwardly downwardly in the coordinate system shown in FIG. 26 or 27).

Comparing the attraction magnet 23 to be provided in parallel to the spring element, in respect to the amount of heat generation in the linear motor 4 such as described above, as for the type in which a telescopic structure is used and a floating force is applied to the wafer stage top plate 12, in order to make the amount of heat generation small, the system should be stable at the exposure position. In the type wherein a nontelescopic structure is used and a force in the gravity direction is applied to the top plate 12, in order to make the heat generation small, the system should be stable at the exposure position. Being stable at the exposure position is, of course, desirable.

Thus, in the type in which a telescopic structure is used and a floating force is applied to the top plate 12, it is difficult to assure both the stability at the exposure position and the small heat generation of the linear motor 4. With the type in which a non-telescopic structure is used and a force in the gravity direction is applied to the top plate 12, both the stability at the exposure position and the small heat generation can be accomplished. Thus, the latter may be preferable in this respect.

The present invention is not limited to the embodiments and examples described above, and various modifications are possible. For example, the attracting magnet 23 of telescopic structure in the sixth embodiment of FIG. 13 may be omitted, and the weight supporting mechanism for the top plate 12 may be provided only by use of the leaf spring 71. Further, the magnet 55 of telescopic structure of the seventh embodiment shown in FIG. 19 may be omitted, and the weight supporting mechanism may be provided only by the L-shaped leaf spring 80.

Embodiment of Device Manufacturing Method

Next, an embodiment of a semiconductor device manufacturing method which uses an exposure apparatus with a supporting system such as described above, will be explained.

Figure 31:
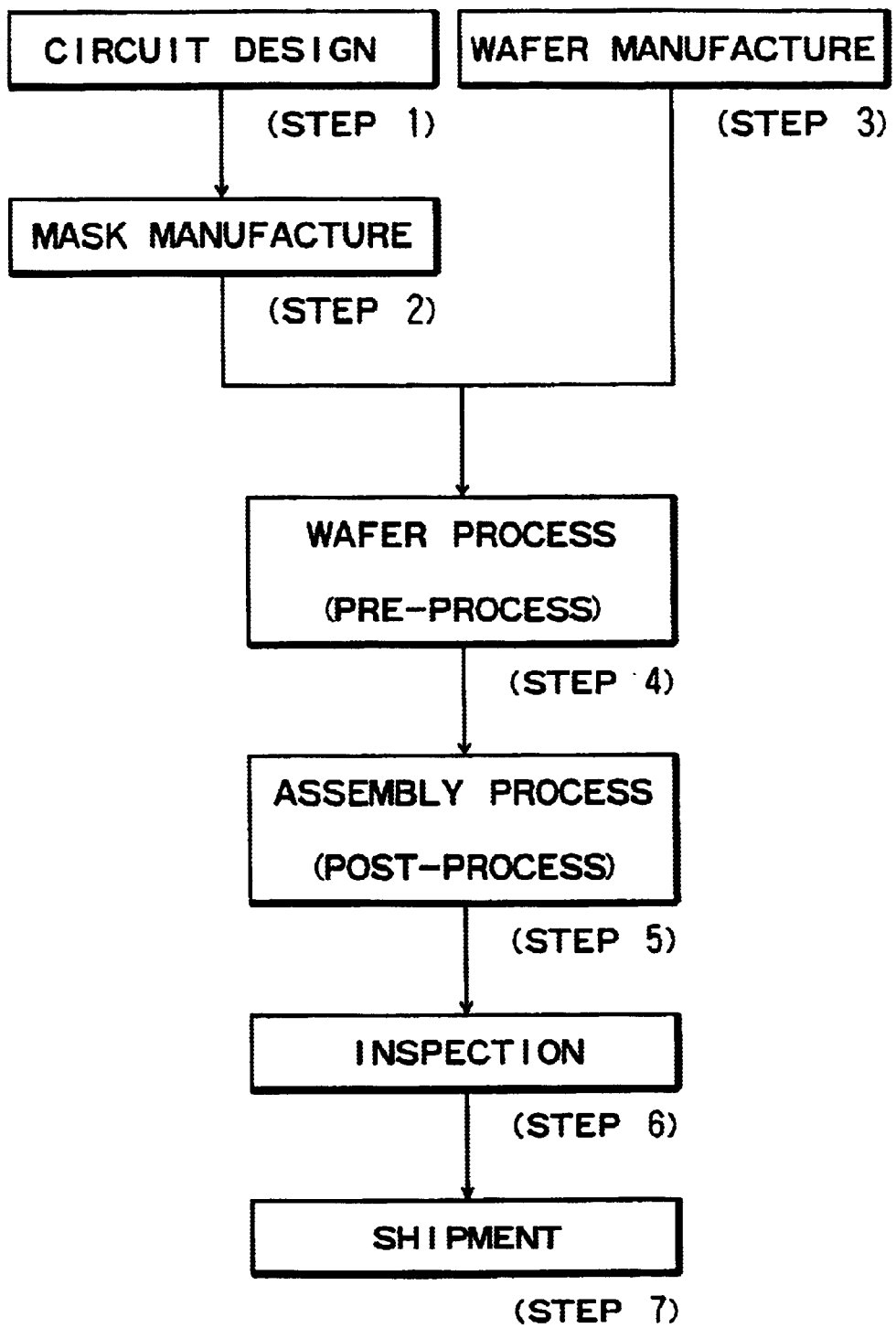
FIG. 31 is a flow chart for explaining an embodiment of a device manufacturing method using an exposure apparatus having a supporting system of the present invention.

FIG. 31 is a flow chart of procedure for manufacture of microdevices such as semiconductor chips (eg. ICs or LSIs), liquid crystal panels, CCDS, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a preprocessing wherein, by using the so prepared mask and wafer, circuits are practically formed on the wafer through lithography. Step 5 subsequent to this is an assembling step (called a postprocess) wherein the water having been processed by step 4 is formed into semi conductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 32:
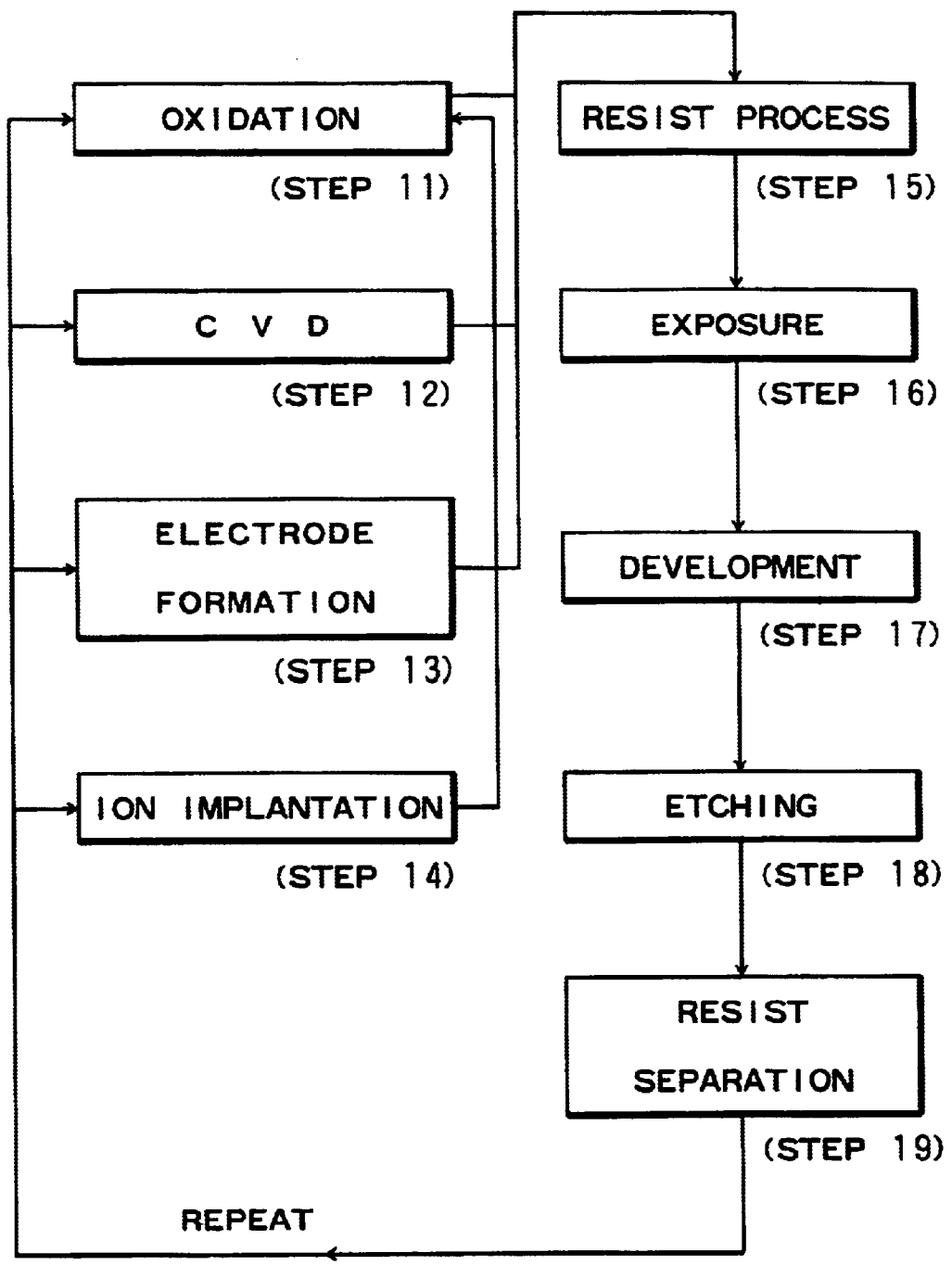
FIG. 32 is a flow chart for explaining details of the water process in the procedure of FIG. 31.

FIG. 32 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A supporting system, comprising:
   a carrying member for carrying thereon a workpiece; and
   a supporting mechanism for supporting said carrying member, said supporting mechanism having a first element for producing a resisting force to a shift in a supporting direction, and a second element for producing a force for increasing the shift in the supporting direction,
   wherein said second element can produce a force for moving said carrying member downwardly.

2. A supporting system according to claim 1, wherein said supporting mechanism includes a spring element and a magnet element.

3. A supporting system according to claim 2, wherein, adjacent to a workpiece processing position for processing the workpiece, a weight of said carrying member and a combined force of said first and second elements are substantially equal to each other.

4. A supporting system, comprising:
   a carrying member for carrying a workpiece thereon; and
   a supporting mechanism for supporting said carrying member from a workpiece transfer position to a workpiece processing position, said supporting mechanism having a first element for producing a resisting force to a shift in a supporting direction, and a second element for producing a force to increase a shift in the supporting direction.

5. A supporting system according to claim 4, wherein said second element for producing a force to increase the shift produces a force to move said carrying member downwardly.

6. A supporting system according to claim 4, wherein, adjacent to the workpiece processing position, the weight of said carrying member and a combined force of said first and second elements are approximately equal to each other.

7. A supporting system according to claim 4, wherein the force to be produced by said second element is larger at the transfer position than at the workpiece processing position.

8. A supporting system according to claim 4, wherein said first and second elements include a spring element and a magnet element.

9. A supporting system, comprising:
   a carrying member for carrying a workpiece thereon; and
   a supporting mechanism for supporting said carrying member between a workpiece transfer position and a workpiece processing position, said supporting mechanism having a spring element and a plurality of magnet elements,
   wherein, adjacent to the workpiece processing position, the weight of said carrying member and a combined force of a force produced by said spring element and a force produced by said plurality of magnet elements are approximately equal to each other, and
   wherein a clearance between said plurality of magnet elements when said carrying member is present at the transfer position is smaller than the clearance when said carrying member is present at the workpiece processing position, wherein, adjacent to the workpiece processing position, an absolute value of a changing rate of the force produced by said plurality of magnet elements with respect to a change in the clearance, is set smaller than an absolute value of a changing rate of the force produced by said spring element with respect to a change in the clearance.

10. A supporting system according to claim 9, wherein there is a position at which, with a clearance smaller than the clearance when said carrying member is present at the workpiece processing position, the weight of said carrying member and the combined force of the force produced by said spring element and the force produced by said plurality of magnet elements become approximately equal to each other.

11. A supporting system, comprising:

a carrying member for carrying a workpiece thereon; and a supporting mechanism for supporting said carrying member between a workpiece transfer position and a workpiece processing position, said supporting mechanism having a spring element and a plurality of magnet elements, wherein, adjacent to the workpiece processing position, the weight of said carrying member and a combined force of a force produced by said spring element and a force produced by said plurality of magnet elements are approximately equal to each other, and wherein a clearance between said plurality of magnet elements when said carrying member is present at the transfer position is larger than the clearance when said carrying member is present at the workpiece processing position, wherein, adjacent to the workpiece processing position, an absolute value of a changing rate of the force produced by said plurality of magnet elements with respect to a change in the clearance, is set larger than an absolute value of a changing rate of the force produced by said spring element with respect to a change in the clearance.

12. A supporting system according to claim 11, wherein there is a position at which, with a clearance larger than the clearance when said carrying member is present at the workpiece processing position, the weight of said carrying member and the combined force of the force produced by said spring element and the force produced by said plurality of magnet elements become approximately equal to each other.

13. A supporting system, comprising:

a carrying member for carrying a workpiece thereon; and a supporting mechanism for supporting said carrying member between a workpiece transfer position and a workpiece processing position, said supporting mechanism having a spring element and a plurality of magnet elements, wherein, adjacent to the workpiece processing position, an absolute value of a changing rate of the force produced by said plurality of magnet elements with respect to a change in the clearance of the magnet elements is set smaller than an absolute value of a changing rate of the force produced by said spring element with respect to a change in the clearance.

14. A supporting system, comprising:

a carrying member for carrying a workpiece thereon; and a supporting mechanism for supporting said carrying member between a workpiece transfer position and a workpiece processing position, said supporting mechanism having a spring element and a plurality of magnet elements, wherein, adjacent to the workpiece processing position, an absolute value of a changing rate of the force produced by said plurality of magnet elements with respect to a change in the clearance of the magnet elements is set larger than an absolute value of a changing rate of the force produced by said spring element with respect to a change in the clearance.

15. A supporting system, comprising:

a carrying member for carrying a workpiece thereon; and a supporting mechanism for supporting said carrying member between a workpiece transfer position and a workpiece processing position, wherein, when said carrying member is present adjacent to the workpiece transfer position and when said carrying member is present adjacent to the workpiece processing position, the weight of said carrying member and a force to be applied from said supporting mechanism to said carrying member are substantially balanced, and wherein said supporting mechanism has a first element for producing a resisting force to a shift in a supporting direction of said carrying member, and a second element for producing a force for increasing the shift in the supporting direction.

16. A supporting mechanism according to claim 15, wherein said supporting mechanism includes a spring element and a plurality of magnet elements.

* * * * *

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

<u>Title page,</u>
Item [57], ABSTRACT,
Line 1, "Disclosed is a" should read -- A --; and
Lines 5 and 7, "adjacent" should read -- adjacent to --.

<u>Column 1,</u>
Line 13, "203" should read -- 203, --;
Line 30, "guide 204" should read -- guides 204, --;
Line 34, "for" should read -- four --;
Line 38, "shown)" should read -- shown), --;
Line 55, "of" should read -- of a --; and
Lines 64 and 67, "to" should read -- to the --.

<u>Column 2,</u>
Line 2, "in" should read -- in the --;
Line 22, "Airs are" should read -- Air is --;
Line 30, "of" should read -- of a --;
Line 31, "support" should read -- support, --;
Line 32, "electric current which nay" should read -- electrical current, which may --;
Line 33, "generation is not flown thereto." should read -- generation, is not generated therein. --;
Line 52, "shown)" should read -- shown), --;
Line 53, "direction," should read -- directions, --;
Line 59, "of rough-motion x," should read -- for rough-motion X, --; and
Line 61, "θ." should read -- θ control. --.

<u>Column 3,</u>
Line 1, "nicer" should be deleted;
Line 3, "member;" should read -- member, --;
Lines 8, 13 and 18, "in" should read -- with --;
Line 30, "electric" should read -- electrical --;
Line 32, "mechanism" should read -- mechanisms --;
Line 42, "direction;" should read -- direction, --;
Line 47, "a" should read -- to a --; and
Line 53, "ing;" should read -- ing: --.

UNITED STATES PATENT AND TRADEMARK OFFICE
CERTIFICATE OF CORRECTION

PATENT NO.    : 6,665,053 B2
DATED         : December 16, 2003
INVENTOR(S)   : Nobushige Korenaga It is certified that error appears in the above-identified patent and that said Letters Patent is hereby corrected as shown below:

Column 4,
Line 11, "element;" should read -- element, --; and "the" should read -- to the --;
Line 16, "clearance" should read -- clearance, --;
Line 26, "the" should read -- to the --;
Line 27, "set" should read -- set to be --;
Line 35, "element;" should read -- element, --; and "the" should read -- to the --;
Line 50, "the" should read -- to the --;
Line 51, "set" should read -- set to be --;
Line 61, "element;" should read -- element, --; and
Line 64, "the" should read -- to the --; and "set" should read -- set to be --.

Column 5,
Lines 1-13 should be deleted;
Line 19, "position;" should read -- position, --; and "the" should read -- to the --;
Line 35, "member;" should read -- member, --;
Line 64, "element;" should read -- element, --; and
Line 65, "adjacent" should read -- adjacent to --.

Column 6,
Lines 9, 22 and 34, "element;" should read -- element, --;
Line 10, "adjacent" should read -- adjacent to --;
Line 17, "intention" should read -- invention --;
Lines 25 and 37, "the" should read -- to the --; and "set" should read -- set to be --;
Line 46, "position:" should read -- position, --; and "the" should read -- to the --;
Line 49, "the" should read -- to the --; and
Line 55, "preparing" should read -- providing --.

Column 7,
Line 3, "2Z" should read -- 2B --;
Line 6, "21" should read -- 2B --;
Line 37, "or" should read -- of --; and
Line 46, "136" should read -- 13B --.

Column 8,
Line 9, "graphs" should read -- graphs, --;
Line 10, "of" should read -- of a --;
Line 37, "13," should read -- 1B, --;
Line 50, "to" should read -- to the --; and
Line 57, "in" should read -- in the --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 9,
Line 7, "iron" should read -- and iron --;
Line 18, "water" should read -- wafer --;
Line 22, "16," should read -- 18, --; and "are" should read -- is --;
Line 48, "there of" should read -- thereof --;
Line 56, "car" should read -- can --;
Line 59, "support" should read -- support, --;
Line 60, "electric current" should read -- electrical current, --; and
Line 61, "generation is not flown thereto. This is as like" should read -- generation, is not generated therein. This is as in --.

Column 10,
Line 3, "for" should read -- four --;
Lines 11 and 13, "each" should read -- each of the --;
Line 14, "electric current is flown" should read -- electrical current flows --;
Line 16, "electric" should read -- electrical --;
Line 19, "in" should read -- in the --;
Line 23, "use" should read -- the use --;
Line 29, "other" should read -- the other --; and "Y" should read -- the Y --;
Line 31, "use of" should read -- the use of a --;
Line 36, "use of" should read -- the use of --;
Line 40, "are" should read -- is --;
Line 41, "like" should read -- in --;
Line 46, "X," should read -- the X, --;
Line 47, "electric" should read -- electrical --;
Line 54, "vibration" should read -- vibrational --; and "disturbance" should read -- disturbance, --;
Line 57, "position" should read -- positional --; and
Line 63, "z" should read -- Z --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 11,
Line 2, "46" should read -- 46, --;
Line 7, "ion" should read -- iron --;
Line 13, "in" should read -- with --;
Line 17, "of" should read -- with --;
Line 18, "like" should read -- as in --;
Line 28, "as" should read -- as in --;
Line 42, "in" should read -- with --;
Line 47, "repulsion forces and thus" should read -- repulsive force, and thus, --;
Line 50, "to a flat coil 16 of the Z linear motor 4" should be deleted;
Line 51 should be deleted;
Line 52, "is fixed" should be deleted;
Line 53, "repulsion" should read -- repulsive --;
Line 59, "use" should read -- the use --; and
Line 63, "of" should read -- of the --; and "like" should read -- as in --.

Column 12,
Line 1, "65," should read -- 6B, --;
Line 10, "Z tilt $\theta$ direction." should read -- the Z tilt $\theta$ directions. --;
Line 19, "an air" should read -- air --;
Line 22, "x" should read -- X --;
Line 26, "as" should read -- as that --; and "Dupli-" should read -- A dupli- --;
Line 29, "support" should read -- support, --;
Line 30, "electric current" should read -- electrical current, --;
Line 31, "generation" should read -- generation, --;
Line 32, "flown thereto." should read -- generated therein. --; and "as" should read -- as in --;
Line 34, "to" should read -- to the --;
Line 35, "electric" should read -- electrical --;
Line 36, "of" should read -- for --;
Line 39, "$\theta$," should read -- $\theta$ control, --;
Line 43, "vibration" should read -- vibrational --;
Line 46, "position" should read -- positional --;
Line 48, "an air or" should read -- air or a --;
Line 49, "the" should read -- of the --;
Line 65, "18" should read -- 18, --; and
Line 66, "12." should read -- 12. In this modified example, as compared therewith, two rectangular parallelepiped magnets 55 are fixed to a flat plate-like yoke 48, and this yoke 48 is fixed to a linear motor yoke 18, which is integral with the wafer stage top plate 12. --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 13,
Line 7, "55" should read -- 55, --;
Lines 17 and 20, "in" should read -- with --;
Line 37, "such" should read -- such a --;
Line 42, "show" should read -- shows --;
Line 44, "as" should read -- as that of --;
Line 45, "example" should read -- example, --;
Line 47, "are" should read -- is --;
Line 51, "constants" should read -- constant, --; and
Line 62, "example" should read -- example, --.

Column 14,
Line 4, "example" should read -- example, --;
Line 13, "e" should read -- $\theta$ --;
Line 25, "without" should read -- without an --;
Line 31, "55" should read -- 55. --;
Line 50, "like" should read -- as in --; and
Line 59, "In" should read -- On --.

Column 15,
Line 5, "where" should read -- when --;
Line 8, "in" should read -- with --;
Line 34, "electric current flown" should read -- electrical current flow --;
Line 41, "67" should read -- 67, --;
Line 46, "the" should read -- that of the --;
Line 47, "is flown" should read -- flows --;
Line 54, "ment as " should read -- ment.  As --;
Line 62, "like" should read -- as in --;
Line 63, "in $\theta$" should read -- in the $\theta$ --; and
Line 67, "in" should read -- in the --.

Column 16,
Line 14, "reduction" should read -- a reduction --;
Line 15, "also reduction in" should read -- also, a reduction in the --;
Line 16, "Also" should read -- Also, --;
Lines 26, 31, 42, 52 and 66, "electric" should read -- electrical --;
Line 30, "need" should read -- needs --;
Lines 41 and 49, "Where" should read -- When --;
Line 43, "may of course" should read -- may, of course, --;
Line 56, "thus" should read -- thus, --; and
Line 58, "In" should read -- On --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 17,
Line 6, "magnet force. In" should read -- magnetic force. On --;
Line 19, "electric" should read -- electrical --;
Line 20, "is flown" should read -- flows --;
Line 24, "of" should read -- of the --;
Line 28, "11." should read -- 18. --;
Line 30, "an" should read -- a --;
Line 53, "of" should read -- of a --;
Line 57, "88" should read -- 88, --;
Line 62, "faces" should read -- face --; and
Line 63, "can not" should read -- cannot --.

Column 18,
Line 15, "Embodiment" should read -- embodiment --;
Line 21, "Where" should read -- When --; and "support" should read -- supports --;
Line 24, "of" should read -- of a --;
Line 27, "as" should read -- as in --;
Line 35, "Also" should read -- Also, --;
Line 50, "stage" should read -- stage, --;
Line 52, "function" should read -- function, --;
Line 53, "bears" should read -- bears, --;
Line 59, "to" should be deleted;
Line 60, "the above of" should read -- above --;
Line 65, "with" should be deleted;
Line 66, "an case where" should read -- a case wherein --; and
Line 67, "where" should read -- wherein --.

Column 19,
Line 10, "electric" should read -- electrical --;
Line 16, "in" should read -- in the --;
Line 17, "can not" should read -- cannot --;
Line 20, "Where" should read -- When --;
Line 26, "sprint" should read -- spring --;
Line 27, "thus" should read -- thus, --;
Line 33, "in" should read -- with --;
Line 45, "are" should be deleted;
Line 63, "example" should read -- example, --; and
Line 67, "16" should read -- 16, --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 20,
Line 2, "example such" should read -- example, such a --;
Line 5, "example" should read -- example, --;
Lines 19 and 24, "like" should read -- as in --;
Lines 21 and 40, "in" should read -- with --;
Line 30, "for" should read -- for an --;
Line 33, "for" should read -- for the --;
Line 45, "Like" should read -- As in --;
Line 47, "function and effect" should read -- functions and effects --; and
Line 66, "88" should read -- 88, --.

Column 21,
Line 15, "units" should read -- unit --;
Line 44, "13," should read -- 13, further --;
Line 46, "Where" should read -- When --; and "with" should read -- with a --;
Line 47, "with" should read -- with a --; and
Line 59, "in" should read -- with --.

Column 22,
Line 1, "are" should be deleted;
Line 23, "example" should read -- example, --;
Line 27, "4" should read -- 4, --;
Line 30, "example such" should read -- example, such a --;
Lines 31 and 33, "example" should read -- example, --;
Line 34, "In place," should read -- Instead, --;
Lines 48 and 53, "like" should read -- as in --;
Line 50, "in" should read -- with --; and
Lines 61 and 64, "for" should read -- for an --.

Column 23,
Line 4, "in" should read -- with --;
Line 6, "further" should read -- a further --;
Line 10, "faces like" should read -- faces. As in --;
Line 15, "Here," should read -- Here, a --;
Lines 21 and 29, "structure" should read -- structure, --;
Lines 28 and 32, "magnet" should read -- magnetic --;
Lines 31 and 35, "of" should read -- of the --; and
Line 34, "shift" should read -- shifts --; and "of" should read -- of the --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 24,
Line 16, "of" should read -- of a --;
Lines 21, 22, 27 and 40, "magnet" should read -- magnetic --;
Line 24, "Where" should read -- When --;
Line 38, "where" should read -- when --;
Line 54, "that" should be deleted; and "are" should read -- being --; and
Line 57, "in" should read -- with --.

Column 25,
Line 2, "period" should read -- periods --;
Line 3, "If" should read -- If, --;
Line 4, "therefore" should read -- therefore, --;
Line 5, "where" should read -- when --;
Line 8, "small and" should read -- small, --;
Line 9, "held" should read -- held to be --;
Lines 19, 22 and 39, "magnet" should read -- magnetic --; and
Line 25, "by" should read -- for by --.

Column 26,
Line 15, "magnet" should read -- magnetic --;
Lines 16 and 18, "where" should read -- when --; and
Lines 20 and 23, "of" should read -- of the --.

Column 27,
Lines 9, 16, 27 and 36, "magnet" should read -- magnetic --;
Line 12, "Where" should read -- When --;
Line 39, "that" should be deleted;
Line 40, "are" should read -- being --;
Line 41, "additionally" should read -- additionally, --;
Line 42, "in" should read -- with --;
Line 56, "period" should read -- periods --;
Line 57, "If" should read -- If, --;
Line 58, "therefore" should read -- therefore, --;
Line 60, "where" should read -- when --;
Line 63, "small and" should read -- small, --;
Line 64, "held" should read -- held to be --; and
Line 65, "made" should read -- made to be --.

UNITED STATES PATENT AND TRADEMARK OFFICE
CERTIFICATE OF CORRECTION

PATENT NO. : 6,665,053 B2
DATED : December 16, 2003
INVENTOR(S) : Nobushige Korenaga It is certified that error appears in the above-identified patent and that said Letters Patent is hereby corrected as shown below:

Column 28,
Line 9, "magnet" should read -- magnetic --;
Line 24, "a" should be deleted; and
Line 55, "in" should read -- with --.

Column 29,
Line 20, "method" should read -- method, --;
Line 23, "of" should read -- of the --; and "for" should read -- for the --;
Line 34, "water" should read -- wafer --;
Line 35, "semi conductor" should read -- semiconductor --;
Line 37, "wherein" should read -- wherein an --; and
Line 38, "check" should read -- check, a --.

Signed and Sealed this

Twenty-third Day of August, 2005

JON W. DUDAS
*Director of the United States Patent and Trademark Office*